(12) United States Patent
Chun

(10) Patent No.: US 11,882,692 B2
(45) Date of Patent: Jan. 23, 2024

(54) SEMICONDUCTOR DEVICE HAVING TRENCH POSITIONED IN A SUBSTRATE AND ALIGNED WITH A SIDE WALL OF A BIT LINE CONTACT PLUG

(71) Applicant: SK hynix Inc., Gyeonggi-do (KR)

(72) Inventor: Jae Houb Chun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/860,721

(22) Filed: Jul. 8, 2022

(65) Prior Publication Data

US 2022/0344349 A1 Oct. 27, 2022

Related U.S. Application Data

(63) Continuation of application No. 17/152,360, filed on Jan. 19, 2021, now Pat. No. 11,424,249.

(30) Foreign Application Priority Data

Aug. 14, 2020 (KR) ........................ 10-2020-0102401

(51) Int. Cl.
*H10B 12/00* (2023.01)

(52) U.S. Cl.
CPC ......... *H10B 12/485* (2023.02); *H10B 12/053* (2023.02); *H10B 12/315* (2023.02); *H10B 12/34* (2023.02); *H10B 12/482* (2023.02)

(58) Field of Classification Search
CPC .... H10B 12/053; H10B 12/34; H10B 12/482; H10B 12/485
USPC ........................................... 257/330
See application file for complete search history.

(56) References Cited

U.S. PATENT DOCUMENTS

2014/0291804 A1* 10/2014 Kim ................... H10B 12/315
257/532

* cited by examiner

*Primary Examiner* — Hoai V Pham
(74) *Attorney, Agent, or Firm* — IP & T GROUP LLP

(57) ABSTRACT

A method includes forming an inter-layer insulation layer on a substrate, forming a plug material penetrating the inter-layer insulation layer and contacting a portion of the substrate, forming a contact plug by etching the plug material, forming a trench exposing a side wall of the contact plug by etching the substrate and the inter-layer insulation layer to be aligned with a side wall of the contact plug, forming a gate insulation layer on a surface of the trench and the exposed side wall of the contact plug, and forming a gate electrode partially filling the trench on the gate insulation layer.

17 Claims, 34 Drawing Sheets

FIH. 6H

US 11,882,692 B2

SEMICONDUCTOR DEVICE HAVING TRENCH POSITIONED IN A SUBSTRATE AND ALIGNED WITH A SIDE WALL OF A BIT LINE CONTACT PLUG

CROSS-REFERENCE TO RELATED APPLICATIONS

The present application is a continuation of U.S. patent application Ser. No. 17/152,360 filed on Jan. 19, 2021, which claims priority to Korean Patent Application No. 10-2020-0102401, filed on Aug. 14, 2020, which is herein incorporated by reference in its entirety.

BACKGROUND

1. Field

Various embodiments of the present disclosure relate to semiconductor devices and methods for manufacturing the same and, more specifically, to semiconductor devices with word lines and bit lines, and methods for manufacturing the same.

2. Description of the Related Art

As semiconductor devices become increasingly more highly integrated, the area occupied by the word line and bit line contact plugs is shrinking. Accordingly, although various technologies have been proposed for preventing a short defect which occurs between a word line and bit line contact plug further improvements are needed. One such technology employs forming an oxide film between the word line and bit line contact plug.

SUMMARY

Embodiments of the present disclosure provide a semiconductor device with bit line contact plugs and gate insulation layers, and a method for manufacturing the semiconductor device.

According to an embodiment of the present disclosure, a method for manufacturing a semiconductor device comprises forming a contact hole in a substrate, filling the contact hole with a plug material, forming a contact plug by etching the plug material, forming a trench exposing a side wall of the contact plug by etching the substrate to be aligned with a side wall of the contact plug, forming a gate insulation layer on the exposed side wall of the contact plug and a surface of the trench, and forming a gate electrode on the gate insulation layer, the gate electrode partially filling the trench.

According to another embodiment of the present disclosure, a method for manufacturing a semiconductor device comprises forming a contact hole in a substrate, forming a plug material filling the contact hole, forming a bit line contact plug by etching the plug material, forming a gate trench exposing a side wall of the bit line contact plug by etching the substrate to be self-aligned with a side wall of the bit line contact plug, forming a buried gate structure filling the gate trench, and forming a bit line on the bit line contact plug.

According to an embodiment of the present disclosure, a semiconductor device comprises a substrate, a bit line contact plug positioned in the substrate, a trench positioned in the substrate and aligned with a side wall of the bit line contact plug, a gate insulation layer formed on a surface of the trench and the side wall of the bit line contact plug, and a gate electrode partially filling the trench on the gate insulation layer, wherein the gate insulation layer includes a first oxide.

According to another embodiment of the present disclosure, a semiconductor device comprises a substrate including an active area, a first trench and a second trench spaced apart from each other and extending in the substrate, a bit line contact plug positioned between the first trench and the second trench and formed in the substrate, a first gate insulation layer formed on a surface of the first trench and a side wall of the bit line contact plug, a second gate insulation layer formed on a surface of the second trench and another side wall of the bit line contact plug, a first gate electrode partially filling the first trench, on the first gate insulation layer, and a second gate electrode partially filling the second trench, on the second gate insulation layer, wherein the first gate insulation layer includes an oxide of a side wall of the bit line contact plug, and wherein the second gate insulation layer includes an oxide of another side wall of the bit line contact plug.

These and other features and advantages of the present disclosure will become apparent to those with ordinary skill in the art of the invention from the following figures and detailed description.

BRIEF DESCRIPTION OF THE DRAWINGS

FIGS. 6A, 6B, 6C, 6D, 6E, 6F, 6G, 6H, and 6I are cross-sectional views illustrating a semiconductor device according to an embodiment of the present disclosure;

DETAILED DESCRIPTION

Figure 1A:
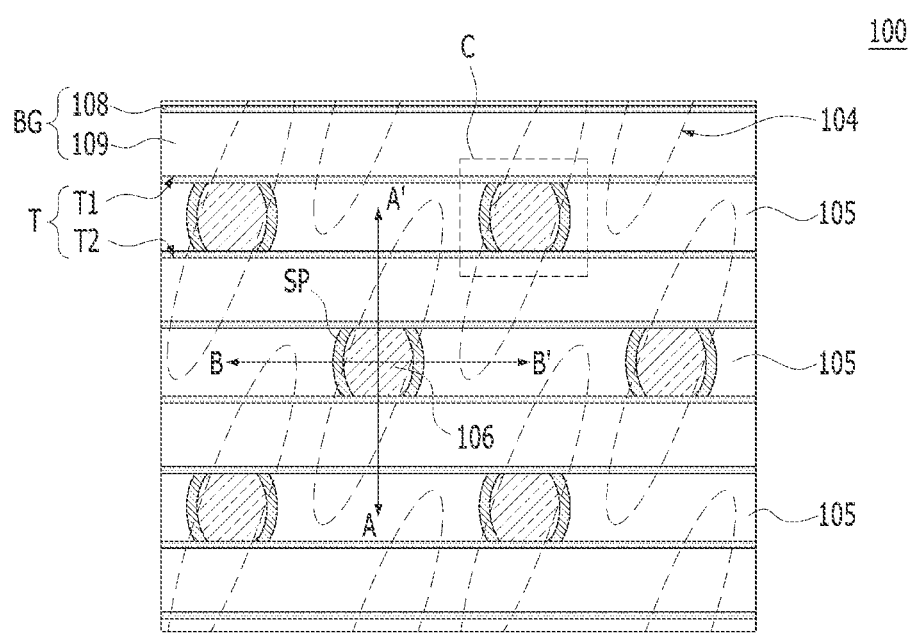
FIGS. 1A, 1B, 1C, and 1D are views illustrating a semiconductor device according to an embodiment of the present disclosure.

Example cross-sectional views, plan views, and block diagrams may be used herein to describe embodiments of the disclosure, and modifications may be made thereto according to, e.g., manufacturing techniques and/or tolerances. Thus, embodiments of the disclosure are not limited to specific types as shown and illustrated herein but may rather encompass changes or modifications resulting from fabricating processes. For example, the regions or areas shown in the drawings may be schematically shown, and their shapes shown are provided merely as examples, and are not intended to limit the category or scope of the disclosure. Elements shown in the drawings may be exaggerated in light of their thicknesses and intervals for illustration purposes. Well known components or elements irrelevant to the subject matter of the disclosure may be omitted from the description. The same or substantially the same reference denotations are used to refer to the same or substantially the same elements throughout the specification and the drawings.

Hereinafter, embodiments of the disclosure are described in detail with reference to the accompanying drawings. For ease of description, the description focuses primarily on dynamic random-access memory (DRAM), but the disclosure is not limited thereto and may be applicable to other memory or semiconductor devices.

Figure 1B:
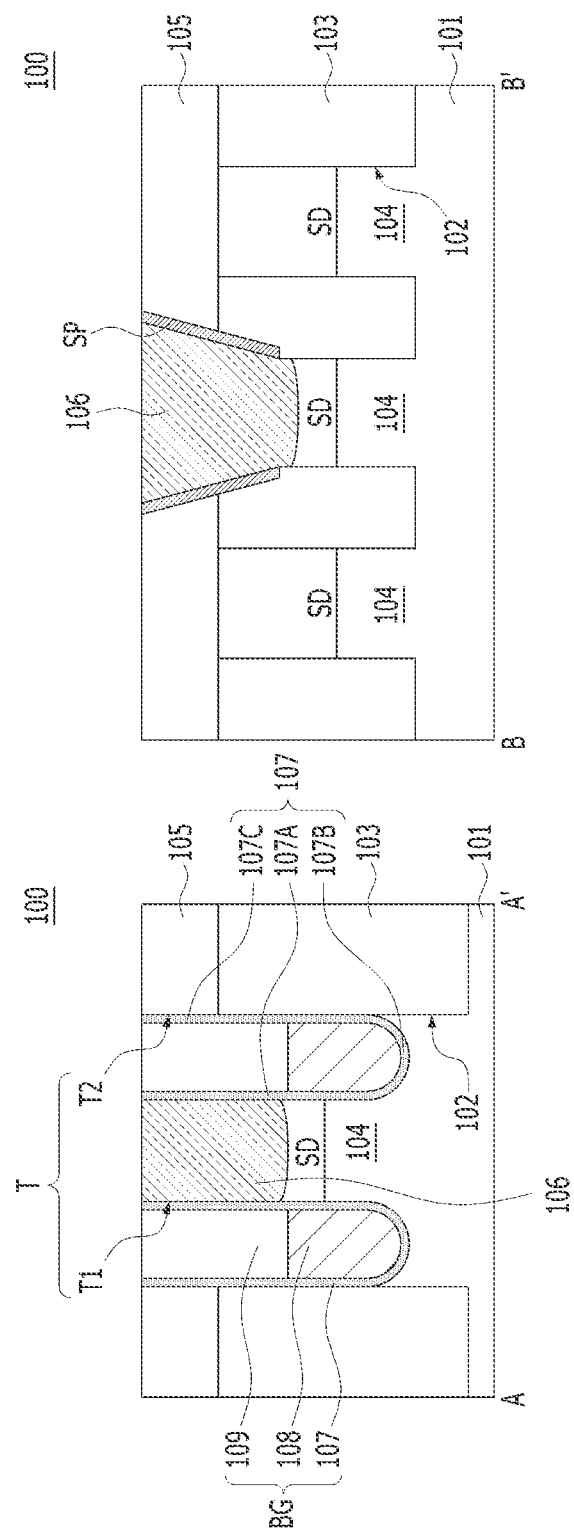
Figure 1C:
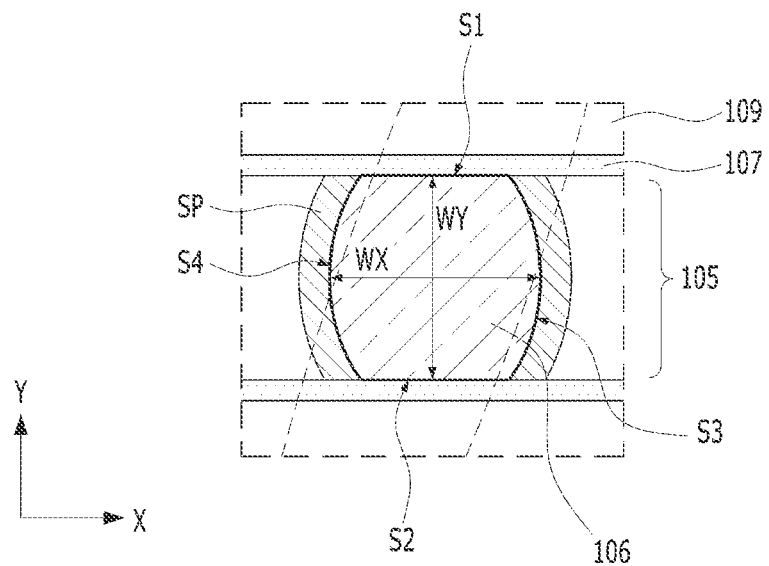
Figure 1D:
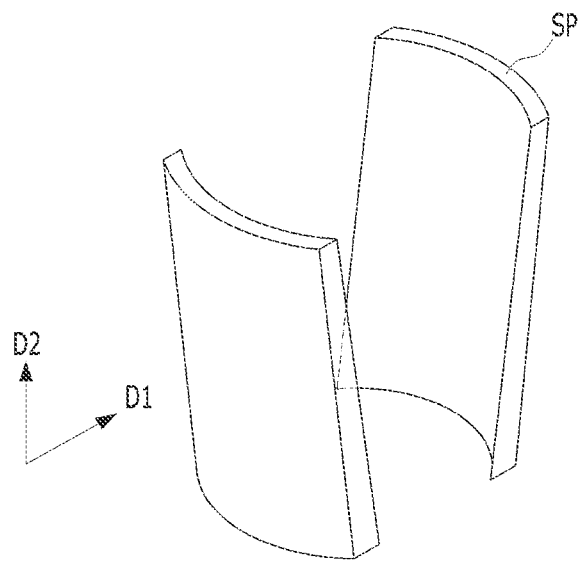

FIGS. 1A, 1B, 1C, and 1D are views illustrating a semiconductor device 100 according to an embodiment of the present disclosure. FIG. 1A is a top view of the semiconductor device 100. FIG. 1B shows cross-sectional views taken along line A-A' and line B-B' of FIG. 1A. FIG. 1C is an enlarged view of portion C of FIG. 1A. FIG. 1D is a perspective view illustrating a plug spacer SP of the semiconductor device 100.

Referring to FIGS. 1A and 1B, an element isolation layer 103 may be formed on a substrate 101. The element isolation layer 103 may be positioned in an isolation trench 102. The active areas 104 may be defined by the element isolation layer 103.

The substrate 101 may include a material appropriate for semiconductor processing. The substrate 101 may include a semiconductor substrate. The substrate 101 may be formed of a silicon-containing material. The substrate 101 may include, for example, silicon, monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The substrate 101 may include other semiconductor materials, e.g., germanium. The substrate 101 may include a compound semiconductor substrate, e.g., a group-III to V semiconductor substrate, such as GaAs. The substrate 101 may include a silicon-on-insulator (SOI) substrate.

The element isolation layer 103 may be a shallow trench isolation (STI) area formed by trench etching. The element isolation layer 103 may be formed by filling a shallow trench, e.g., the isolation trench 102, with an insulation material. The element isolation layer 103 may include, for example, a silicon oxide, a silicon nitride, or a combination thereof. Chemical vapor deposition (CVD) or other deposition processes may be used to fill the isolation trench 102 with the insulation material. A planarization process, such as chemical-mechanical polishing (CMP), may be additionally used.

A source/drain area SD may be formed in the active area 104. A doping process may be performed to form the source/drain areas SD. The doping process may include, e.g., implantation or plasma doping (PLAD). The source/drain areas SD may be doped with a conductive impurity. For example, the conductive impurity may include phosphorus (P), arsenic (As), antimony (Sb), or boron (B). The bottom surface of the source/drain areas SD may be positioned at a predetermined depth from the top surface of the active area 104. The source/drain areas SD may correspond to the source area and the drain area. The source/drain areas SD may have the same depth. The source/drain areas SD may each be an area in which a bit line contact plug or a storage node contact plug is connected.

An inter-layer insulation layer 105 may be formed on and may contact the substrate 101. The inter-layer insulation layer 105 may include an insulation material. The inter-layer insulation layer 105 may include, for example, a silicon oxide, a silicon nitride, a low-k material, or a combination thereof. The inter-layer insulation layer 105 may include tetraethyl orthosilicate (TEOS). The inter-layer insulation layer 105 may include one or more layers. The inter-layer insulation layer 105 may include one or more layers formed of different materials. According to an embodiment, the inter-layer insulation layer 105 may include two layers. According to an embodiment, the inter-layer insulation layer 105 may include a layer formed of silicon oxide and a layer formed of silicon nitride.

A trench T may be formed in the substrate 101. The trench T may be referred to as a 'gate trench.' The trench T may include a first trench T1 and a second trench T2 parallel with the first trench T1. The first trench T1 and the second trench T2 may be spaced apart from each other and extend along a direction. The trench T may have a line shape that crosses the active area 104 and the element isolation layer 103. A side wall of the trench T may abut the source/drain area SD. The bottom surface of the trench T may be at a lower level than the bottom surfaces of the source/drain areas SD. The bottom surface of the trench T may be at a higher level than the bottom surface of the element isolation layer 103. The trench T may include an upper area provided by etching the inter-layer insulation layer 105 and a lower area provided by etching the substrate 101. The lower area of the trench T may have a larger depth than the upper area of the trench T.

A contact plug 106 may be formed between the trenches T. The contact plug 106 may be formed between the first trench T and the second trench T2. The contact plug 106 may penetrate the inter-layer insulation layer 105. The contact plug 106 may be formed in the substrate 101. The contact plug 106 may pass through the inter-layer insulation layer 105 and extend inside the substrate 101. The contact plug 106 may be referred to as a 'buried plug.' The contact plug 106 may include a lower portion extending to the inside of the substrate 101 and an upper portion penetrating the inter-layer insulation layer 105. The depth of the lower portion of the contact plug 106 may be larger than the depth of the upper portion. That is, the depth of the portion extending to the inside of the substrate 101 in the contact plug 106 may be larger than the depth of the portion penetrating the inter-layer insulation layer 105. The contact plug 106 may be buried in the substrate 101.

The top view of the contact plug 106 may be shaped as an oval broken between surfaces facing each other. The top view of the contact plug 106 may be shaped as a circle broken between surfaces facing each other. The top view of the contact plug 106 may have a rectangular shape. The trenches T may be self-aligned with the side surfaces of the contact plug 106. The trenches T may include a first trench T positioned on one side surface of the contact plug 106. The trenches T may include a second trench T positioned on the opposite side surface of the contact plug 106. Both of the side walls of the contact plug 106 may contact the first trench T and the second trench T2. The bottom surface of the trench T may be positioned deeper than the bottom surface of the contact plug 106. A cross section of the contact plug 106 may have the same width at its top and bottom portions. A cross section of the contact plug 106 may have a larger width at the top portion than at the bottom portion. A cross section of the contact plug 106 may have a vertical shape. A cross section of the contact plug 106 may have a sloped shape.

The contact plug 106 may include a semiconductor material. The contact plug 106 may include a silicon-containing material. The contact plug 106 may include, for example, polysilicon. The polysilicon may be doped with an impurity. According to an embodiment, the contact plug 106 may be formed by selective epitaxial growth (SEG). For example, the contact plug 106 may include SEG silicon phosphorus (SiP). A void-free contact plug 106 may be formed by selective epitaxial growth (SEG).

A plug spacer SP may be formed to surround the outer wall of the contact plug 106. The plug spacer SP may not overlap the trench T. The top view of the plug spacer SP may have a discontinuous ring shape. A cross section of the plug spacer SP may have a sloped shape. The plug spacer SP may discontinuously surround the lower outer wall of the contact plug 106. The plug spacer SP may be positioned between trenches T. The plug spacer SP may include an insulation material. The plug spacer SP may include a nitrogen-containing material. The plug spacer SP may include, for example, silicon oxide, silicon nitride, silicon oxynitride, or a combination thereof. According to an embodiment, the plug spacer SP may be formed of silicon nitride. The plug spacer SP may be formed, for example, by chemical vapor deposition (CVD) or atomic layer deposition (ALD). The plug spacer SP may be selectively grown by an atomic layer deposition (ALD) or low-pressure chemical vapor deposition (LPCVD) process using dichlorosilane ($SiH_2Cl_2$) and ammonia ($NH_3$) as reactive gases.

A gate structure BG may be formed in the trench T. The gate structure BG may include a gate insulation layer 107, a gate electrode 108, and a gate capping layer 109. The gate structure BG may extend in the form of a line. The gate structure BG may be referred to as a 'buried gate structure.'

The gate insulation layer 107 may be formed on and may contact the surface and side walls of the trench T. The gate insulation layer 107 may cover the surface and side walls of the trench T. The gate insulation layer 107 may vertically and continuously extend from the bottom surface of the trench T to the side walls of the contact plug 106. The gate insulation layer 107 may be formed by depositing an oxide film or nitride film. The gate insulation layer 107 may be formed by a deposition method, such as chemical vapor deposition (CVD) or atomic layer deposition (ALD). The gate insulation layer 107 may be formed by oxidation as well. The gate insulation layer 107 may be formed by thermal oxidation. According to an embodiment, the gate insulation layer 107 may be formed by oxidating the bottom surface and side walls of the trench T.

The gate insulation layer 107 may include a first oxide 107A, a second oxide 107B, and a third oxide 107C. The first oxide 107A may include an oxide of a side wall of the contact plug 106. The first oxide 107A may be formed by oxidating an exposed side wall of the contact plug 106. The second oxide 107B may include an oxide of an exposed surface of the substrate 101. The second oxide 107B may be formed by oxidating the exposed surface of the substrate 101. The exposed surface of the substrate 101 may be formed by the trench T. The third oxide 107C may include an oxide of an exposed surface of the inter-layer insulation layer 105. The third oxide 107C may be formed by oxidating the exposed surface of the inter-layer insulation layer 105. The exposed surface of the inter-layer insulation layer 105 may be formed by the trench T. The second oxide 107B may extend from the first oxide 107A. The second oxide 107B may extend from the third oxide 107C.

The gate insulation layer 107 may include, for example, silicon oxide, silicon nitride, silicon oxynitride, a high-k material, or a combination thereof. The high-k material may include a material having a larger dielectric constant than the dielectric constant of silicon oxide. The high-k material may include at least one metallic element. The high-k material may include a hafnium-containing material. The hafnium-containing material may include hafnium oxide, hafnium silicon oxide, hafnium silicon oxynitride, or a combination thereof. According to an embodiment, the high-k material may include lanthanum oxide, lanthanum aluminum oxide, zirconium oxide, zirconium silicon oxide, zirconium silicon oxynitride, aluminum oxide, or a combination thereof. As the high-k material, other known high-k materials may be optionally used. The first oxide 107A, the second oxide 107B, and the third oxide 107C may include the same material. The first oxide 107A, the second oxide 107B, and the third oxide 107C may include, for example, silicon oxide.

The gate electrode 108 may be formed on and may contact the gate insulation layer 107. The gate electrode 108 may partially fill the trench T. To form the gate electrode 108, a recess process may be performed. Accordingly, the gate electrode 108 may be referred to as a 'buried gate electrode' or 'buried word line.' The top surface of the gate electrode 108 may be at a lower level than the bottom surface of the contact plug 106. The top surface of the gate electrode 108 may be at the same level as the bottom surface of the contact plug 106.

The gate electrode 108 may include a metal, metal nitride, or a combination thereof. For example, the gate electrode 108 may be formed of titanium nitride (TiN), tungsten (W), or titanium nitride/tungsten (TiN/W). The titanium nitride/tungsten (TiN/W) may have a structure which results from conformally forming titanium nitride and then partially filling the trench T with tungsten. The gate electrode 108 may include titanium nitride. The gate electrode 108 may include a tungsten-containing material that includes tungsten as a main element.

The gate capping layer 109 may be formed on and may contact the gate electrode 108. The gate capping layer 109 may fill the rest of the trench T. The gate capping layer 109 may neighbor the contact plug 106, with the gate insulation layer 107 therebetween separating the two. That is, the gate insulation layer 107 may extend to be positioned between the gate capping layer 109 and the contact plug 106 to electrically isolate the two. The top surface of the gate capping layer 109 may be at the same level as the top surface of the inter-layer insulation layer 105. The gate capping layer 109 includes an insulation material. The gate capping layer 109 may include, for example, silicon nitride. According to an embodiment, the gate capping layer 109 may include, for example, silicon oxide. According to an embodiment, the gate capping layer 109 may have a multi-layer nitride-oxide-nitride (NON) structure.

Referring to FIG. 1C, the contact plug 106 may include a first side surface S1 and a second side surface S2 positioned opposite the first side surface S1. The top view of the contact plug 106 may include a third side surface S3 and a fourth side surface S4 positioned opposite the third side surface S3. The first and second side surfaces S1 and S2 may cross the third and fourth side surfaces S3 and S4.

The first side surface S1 may be parallel with the second side surface S2. The first side surface S1 and the second side surface S2 may have a straight shape. The first side surface S1 and the second side surface S2 may have a straight profile. The first side surface S1 and the second side surface S2 may not directly contact the plug spacer SP. The first side surface S1 and the second side surface S2 may directly contact the gate insulation layer 107.

The third side surface S3 and the fourth side surface S4 may face each other. The third side surface S3 and the fourth side surface S4 may have a curved or round shape. The third side surface S3 and the fourth side surface S4 may have a curved or round profile. The third side surface S3 and the fourth side surface S4 may directly contact the plug spacer SP. The third side surface S3 and the fourth side surface S4 may not directly contact the gate insulation layer 107.

The top view of the contact plug 106 may have various shapes, including, for example, a circle, oval, or rectangle. The width WX in the X direction of the contact plug 106 may be the same as the width WY in the Y direction. The width WX in the X direction of the contact plug 106 may be smaller than the width WY in the Y direction. The width WX in the X direction of the contact plug 106 may be larger than the width WY in the Y direction.

Referring to FIG. 1D, the plug spacer SP may include a pair of side walls facing each other. The plug spacer SP may have a curved or round shape. The plug spacer SP may include parallel cross sections.

The top view of the cross section in the D1 direction of the plug spacer SP may have a discontinuous ring shape. The top view of the cross section in the D1 direction of the plug spacer SP may have curved or round shapes facing each other. The interval between a pair of side walls facing each other of the plug spacer SP may decrease from the upper level to the lower level. A cross section in the D2 direction of the plug spacer SP may have a sloped shape. A cross section in the D2 direction of the plug spacer SP may have a straight shape.

According to the above-described embodiment, the process difficulty in forming the contact plug 106 may be reduced by forming the contact plug 106 earlier than the gate structure BG. Thus, a stable structure may be formed. Further, a short defect between the contact plug 106 and the gate electrode 108 may be mitigated by forming the gate insulation layer 107 on the side wall of the contact plug 106.

FIGS. 2A to 2K and FIGS. 3A to 3K are views illustrating a method for manufacturing a semiconductor device according to an embodiment of the present disclosure. FIGS. 2A to 2K are top views of a semiconductor device. FIGS. 3A to 3K are cross-sectional views taken along line A-A' and B-B' of FIGS. 2A to 2K.

Figure 2A:
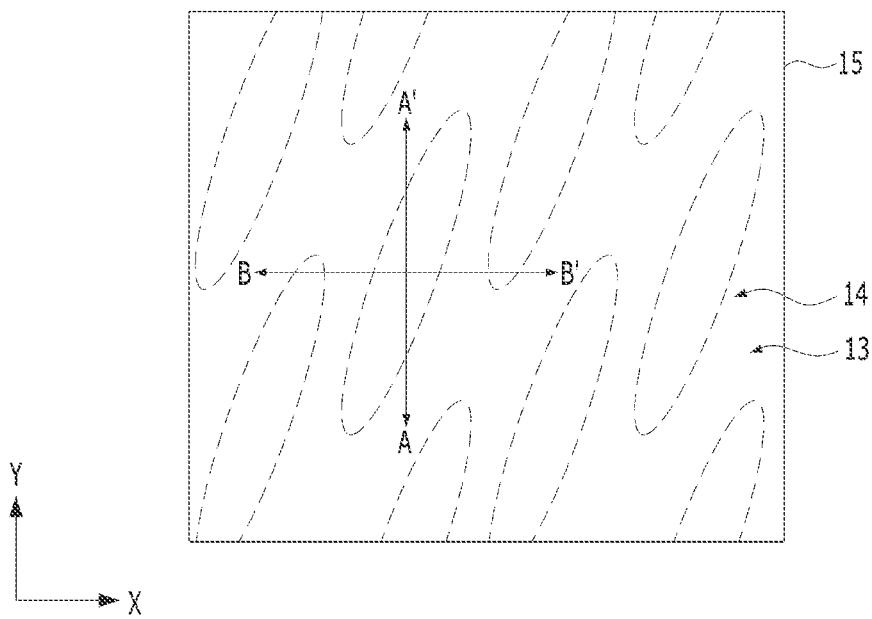
FIGS. 2A, 2B, 2C, 2D, 2E, 2F, 2G, 2H, 2I, 2J, and 2K are views illustrating a method for manufacturing a semiconductor device according to an embodiment of the present disclosure.
Figure 3A:
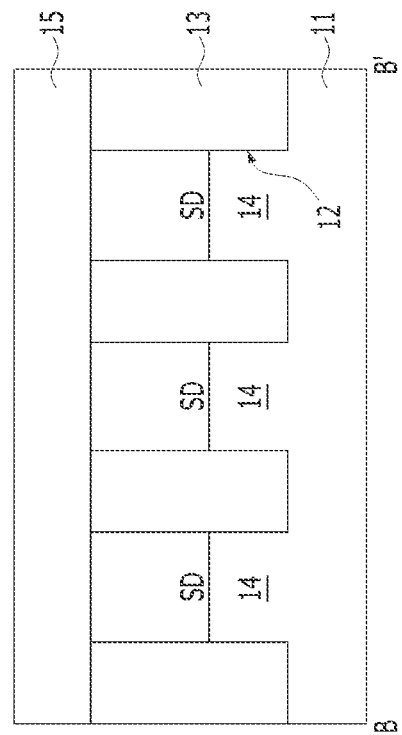
FIGS. 3A, 3B, 3C, 3D, 3E, 3F, 3G, 3H, 3I, 3J, and 3K are cross-sectional views taken along line A-A' and line B-B' of FIG. 2A to 2K.
Figure 3A:
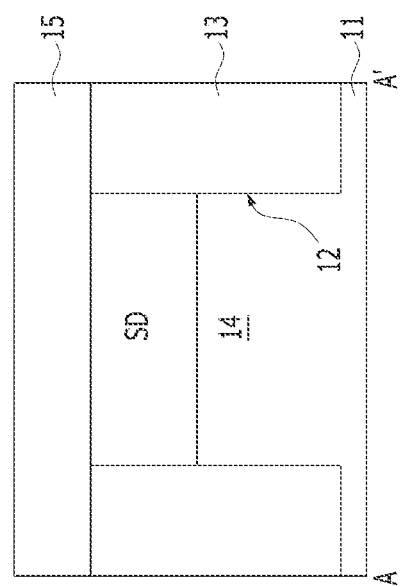

Referring to FIGS. 2A and 3A, a substrate 11 is prepared. The substrate 11 may include a material appropriate for semiconductor processing. The substrate 11 may include a semiconductor substrate. The substrate 11 may be formed of a silicon-containing material. The substrate 11 may include, for example, silicon, monocrystalline silicon, polysilicon, amorphous silicon, silicon-germanium, monocrystalline silicon-germanium, polycrystalline silicon-germanium, carbon-doped silicon, a combination thereof or a multi-layer structure thereof. The substrate 11 may include other semiconductor material, e.g., germanium. The substrate 11 may include a compound semiconductor substrate, e.g., a group-III to V semiconductor substrate, such as GaAs. In an embodiment, the substrate 11 may include a silicon-on-insulator (SOI) substrate.

An element isolation layer 13 and active areas 14 may be formed in the substrate 11. The active areas 14 may be defined by the element isolation layer 13. The element isolation layer 13 may be a shallow trench isolation (STI) area formed by trench etching. The element isolation layer 13 may be formed by filling a shallow trench, e.g., the isolation trench 12, with an insulation material. The element isolation layer 13 may include, for example, a silicon oxide, a silicon nitride, or a combination thereof. Chemical vapor deposition (CVD) or other deposition processes may be used to fill the isolation trench 12 with the insulation material. A planarization process, such as chemical-mechanical polishing (CMP), may be additionally used.

Source/drain areas SD may be formed in the active area 14. A doping process may be performed to form the source/drain areas SD. The doping process may include, e.g., implantation or plasma doping (PLAD). The source/drain areas SD may be doped with a conductive impurity. For example, the conductive impurity may include phosphorus (P), arsenic (As), antimony (Sb), or boron (B). The bottom surface of each of the source/drain areas SD may be positioned at a predetermined depth from the top surface of the active area 14. The source/drain areas SD may correspond to the source area and the drain area. The source/drain areas SD may have the same depth. The source/drain areas SD may each be an area in which a bit line contact plug or a storage node contact plug is connected.

An inter-layer insulation layer 15 may be formed on and may contact the substrate 11. The inter-layer insulation layer 15 may include an insulation material. The inter-layer insulation layer 15 may include, for example, a silicon oxide, a silicon nitride, a low-k material, or a combination thereof. In an embodiment, the inter-layer insulation layer 15 may include tetraethyl orthosilicate (TEOS). The inter-layer insulation layer 15 may include one or more layers. The inter-layer insulation layer 15 may include one or more layers formed of different materials. According to an embodiment, the inter-layer insulation layer 15 may include two layers. According to an embodiment, the inter-layer insulation layer 15 may include a layer formed of silicon oxide and a layer formed of silicon nitride.

Figure 2B:
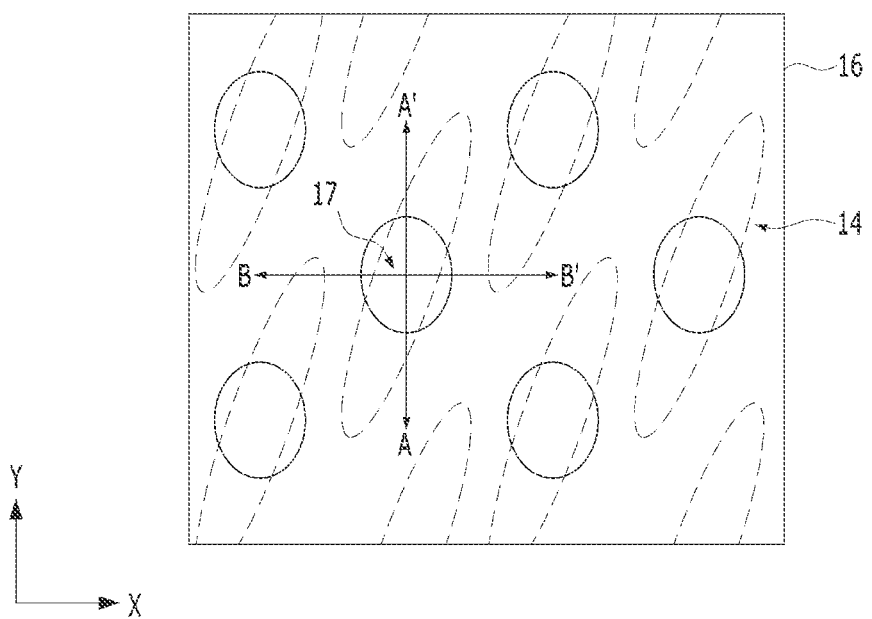
Figure 3B:
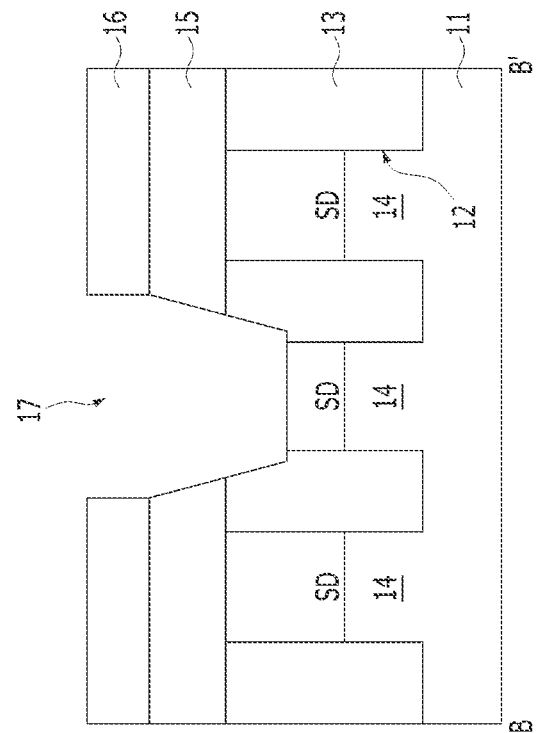
Figure 3B:
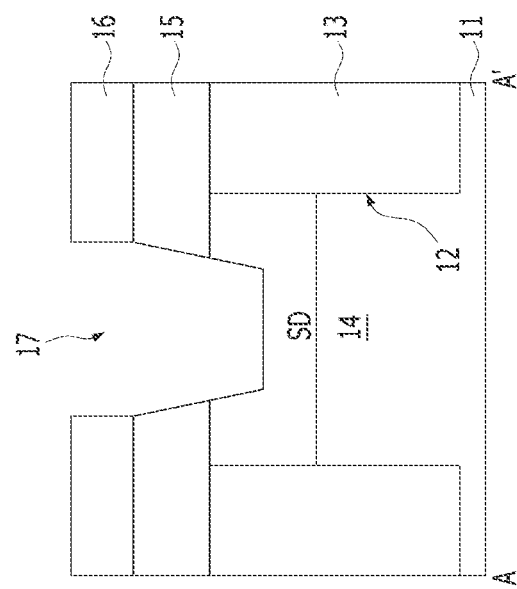

Referring to FIGS. 2B and 3B, a contact hole mask 16 may be formed on and may contact the inter-layer insulation layer 15. The contact hole mask 16 may include a photoresist pattern.

A contact hole 17 may be formed by etching the inter-layer insulation layer 15 using the contact hole mask 16 as an etch mask. From a top view, the contact hole 17 may be shaped as a circle or oval. The contact hole 17 may be formed to penetrate the inter-layer insulation layer 15. A step of recessing the exposed surface of the substrate 11 may be included. The contact hole 17 may be formed in the substrate 11. Upon etching the inter-layer insulation layer 15 using the contact hole mask 16 as an etch mask, a portion of the substrate 11 may be etched together with the inter-layer insulation layer 105. Accordingly, a portion of the substrate 11 may be exposed through the contact hole 17. The bottom surface of the contact hole 17 may be positioned at a lower level than the top surface of the substrate 11. The bottom surface of the contact hole 17 may be positioned at a higher level than the bottom surface of the source/drain area SD.

Figure 2C:
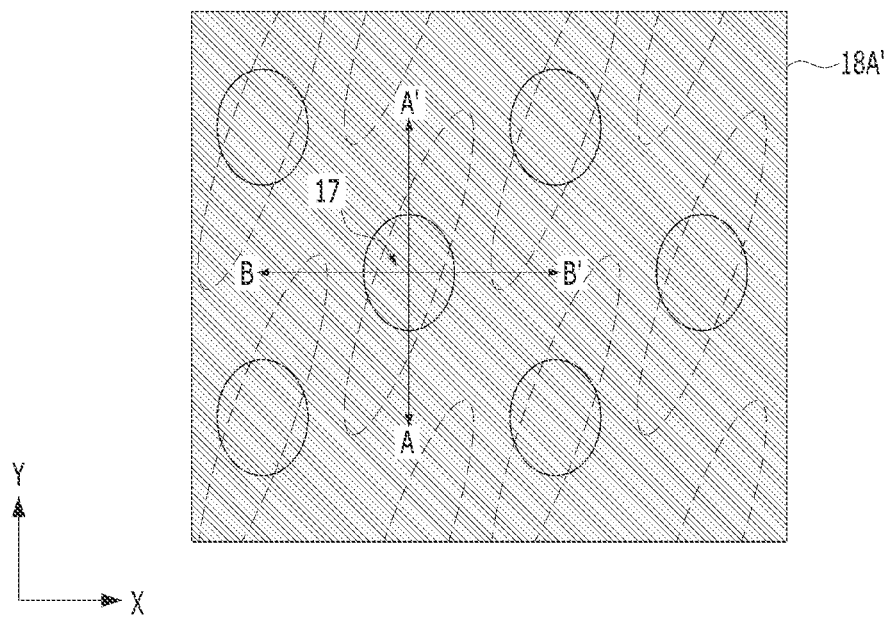
Figure 3C:
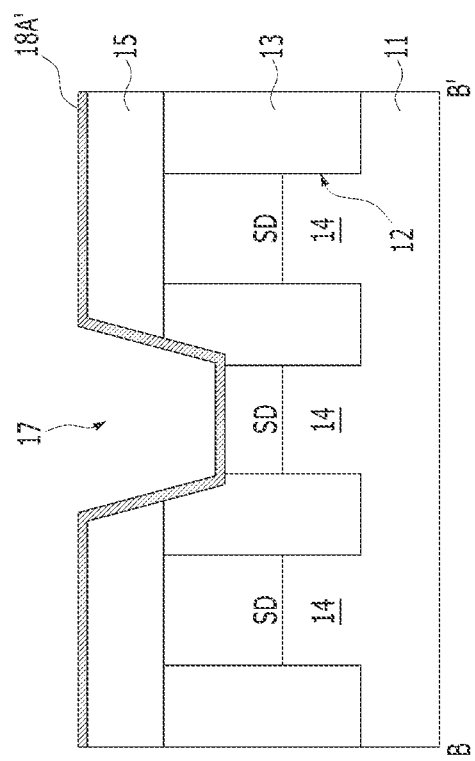
Figure 3C:
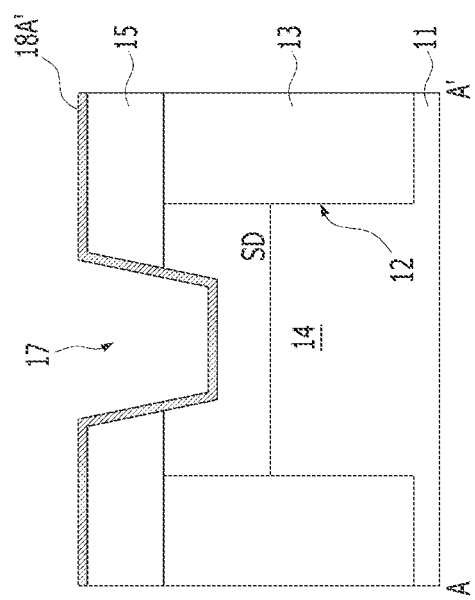

Referring to FIGS. 2C and 3C, a preliminary spacer layer 18A' may be formed to cover the inter-layer insulation layer 15 and the contact hole 17. The preliminary spacer layer 18A' may include an insulation material. The preliminary spacer layer 18A' may include a nitrogen-containing material. The preliminary spacer layer 18A' may include, for example, silicon oxide, silicon nitride, silicon oxynitride, or a combination thereof. According to an embodiment, the preliminary spacer layer 18A' may be formed of silicon nitride.

The preliminary spacer layer 18A' may be formed, for example, by chemical vapor deposition (CVD) or atomic layer deposition (ALD). The preliminary spacer layer 18A' may be selectively grown by an atomic layer deposition (ALD) or low-pressure chemical vapor deposition (LPCVD) process using dichlorosilane ($SiH_2Cl_2$) and ammonia ($NH_3$) as reactive gases.

Figure 2D:
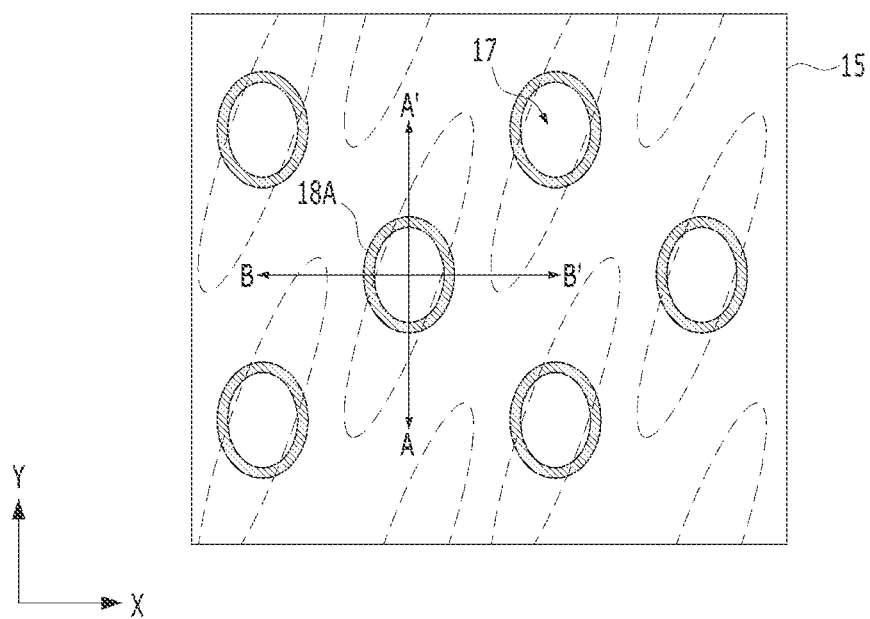
Figure 3D:
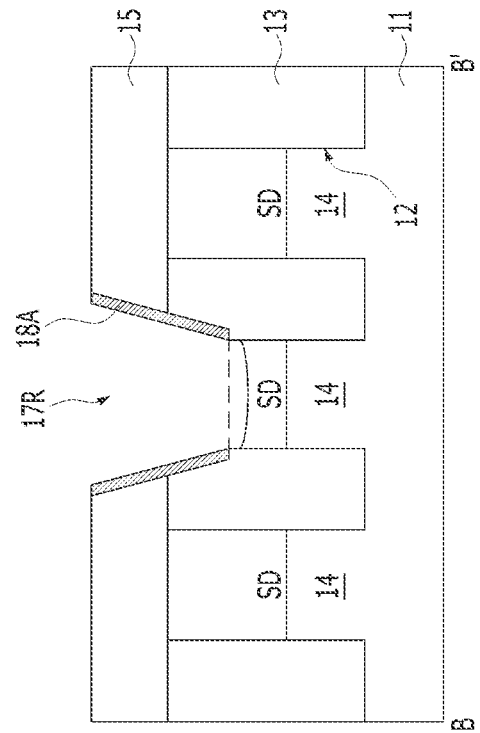
Figure 3D:
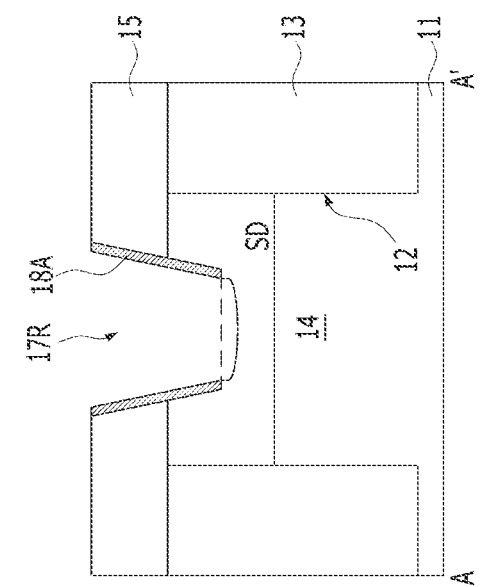

Referring to FIGS. 2D and 3D, a preliminary spacer 18A may be formed by etching the preliminary spacer layer 18A'. As the preliminary spacer 18A is formed, a portion of the substrate 11 may be exposed. As the preliminary spacer 18A is formed, the bottom surface of the contact hole 17 may be exposed. The surface of the substrate 11 which is exposed inside the contact hole 17, may be further expanded using the preliminary spacer 18A. The substrate 11 exposed inside the contact hole 17 may be further recessed using the preliminary spacer 18A. The surface of the substrate 11, exposed inside the contact hole 17, may be further etched using the preliminary spacer 18A. Accordingly, a recessed contact hole 17R may be formed.

The recessed contact hole 17R may penetrate the inter-layer insulation layer 15. The bottom surface of the recessed contact hole 17R may be formed in the substrate 11. The recessed contact hole 17R may penetrate the inter-layer insulation layer 105 and be formed in the substrate 11.

As the preliminary spacer 18A is formed, the top surface of the inter-layer insulation layer 15 may be exposed. The preliminary spacer 18A may cover the side wall of the recessed contact hole 17R. The preliminary spacer 18A may be shaped to surround the side wall of the recessed contact hole 17R. From a top view, the preliminary spacer 18A may have a ring shape. The circumference of the preliminary spacer 18A may narrower from the top of the preliminary spacer 18A to the bottom. A cross section of the preliminary spacer 18A may have a sloped shape.

Figure 2E:
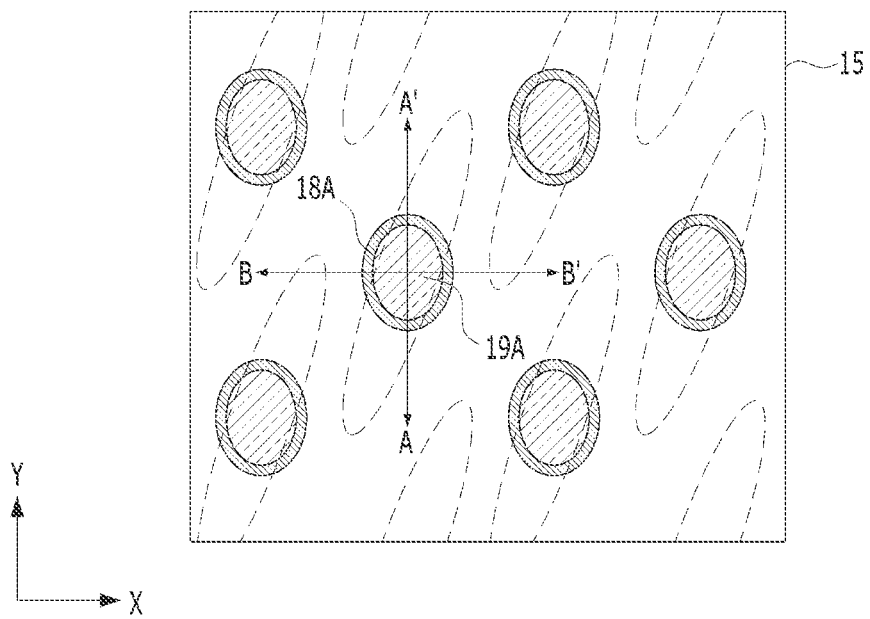
Figure 3E:
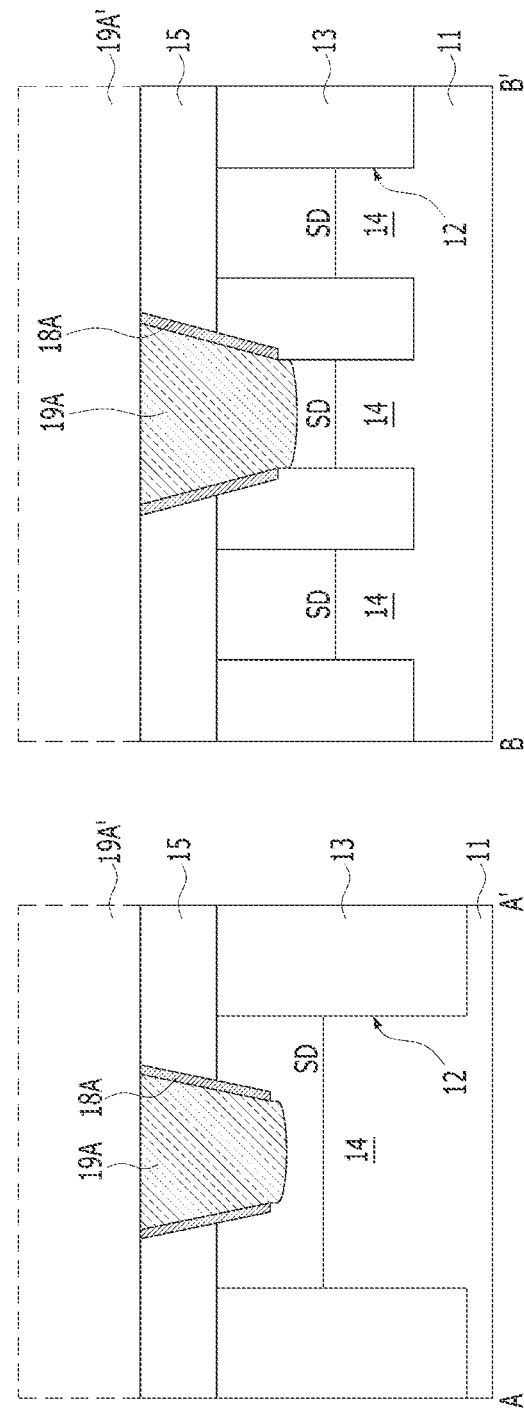

Referring to FIGS. 2E and 3E, a plug material 19A may be formed in the contact hole 17R. The plug material 19A may fill the contact hole 17R. To form the plug material 19A, a plug material layer 19A' may be formed to cover the inter-layer insulation layer 15. There may be included the process of planarizing the plug material layer 19A' to expose the top surface of the inter-layer insulation layer 15. Accordingly, the top surface of the plug material 19A may be exposed. The top surface of the plug material 19A may be at the same level as the top surface of the inter-layer insulation layer 15. The plug material 19A may penetrate the inter-layer insulation layer 15 and contact a portion of the substrate 11.

The plug material 19A may include a semiconductor material. The plug material 19A may include a conductive material. The plug material 19A may include a silicon-containing material. The plug material 19A may include, for example, polysilicon. The polysilicon may be doped with an impurity. According to an embodiment, the plug material 19A may be formed by selective epitaxial growth (SEG). For example, the plug material 19A may include SEG silicon phosphorus (SiP). As such, a void-free plug material 19A may be formed by SEG.

Figure 2F:
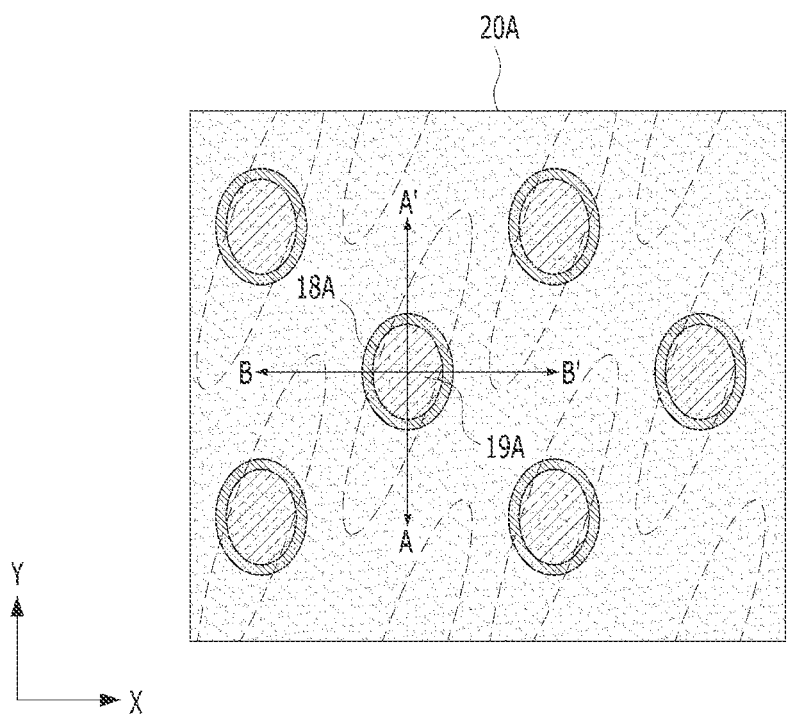
Figure 3F:
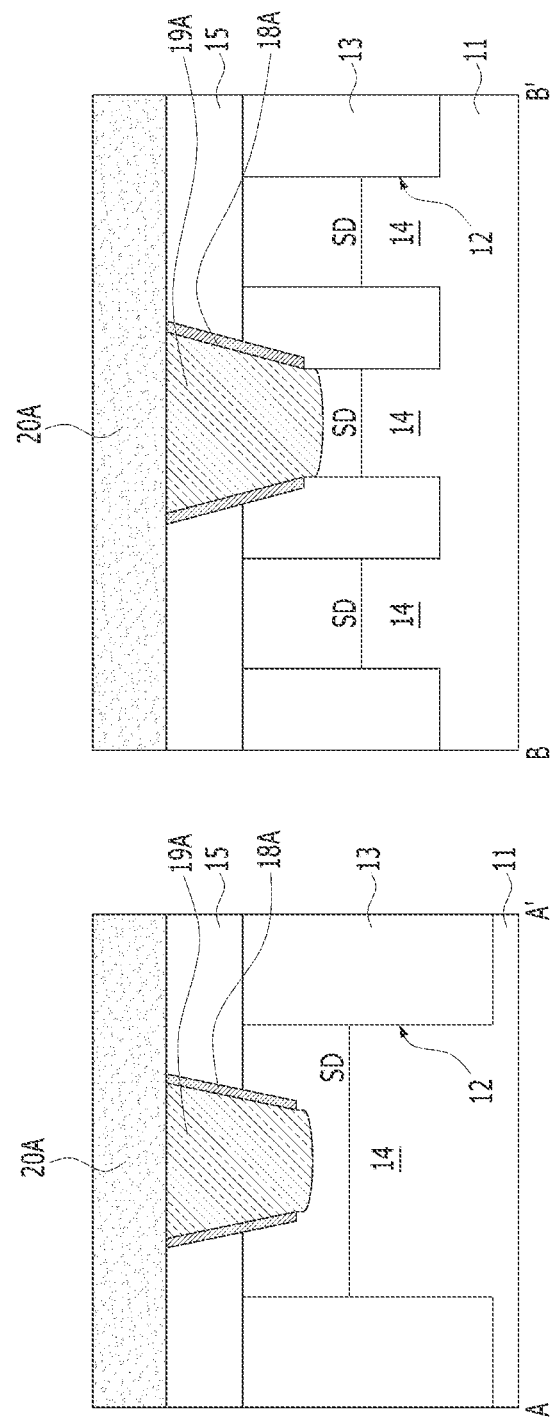

Referring to FIGS. 2F and 3F, a trench hard mask layer 20A may be formed on and may directly contact the inter-layer insulation layer 15 and the plug material 19A. The trench hard mask layer 20A may be formed to define at least one or more openings in the inter-layer insulation layer 15. The trench hard mask layer 20A may have a multi-layer structure. The trench hard mask layer 20A may include one or more layers. The height of the trench hard mask layer 20A may be larger than the height of the inter-layer insulation layer 15. The trench hard mask layer 20A may include, for example, silicon oxide, silicon nitride, silicon oxynitride, or a combination thereof. According to an embodiment, the trench hard mask layer 20A may be formed of silicon nitride.

The trench hard mask layer 20A may be formed, for example, by chemical vapor deposition (CVD), physical vapor deposition (PVD), or atomic layer deposition (ALD). To increase the deposition effect, the trench hard mask layer 20A may use a plasma. For example, the trench hard mask layer 20A may be formed by plasma enhanced CVD (PECVD) or plasma enhanced ALD (PEALD).

Figure 2G:
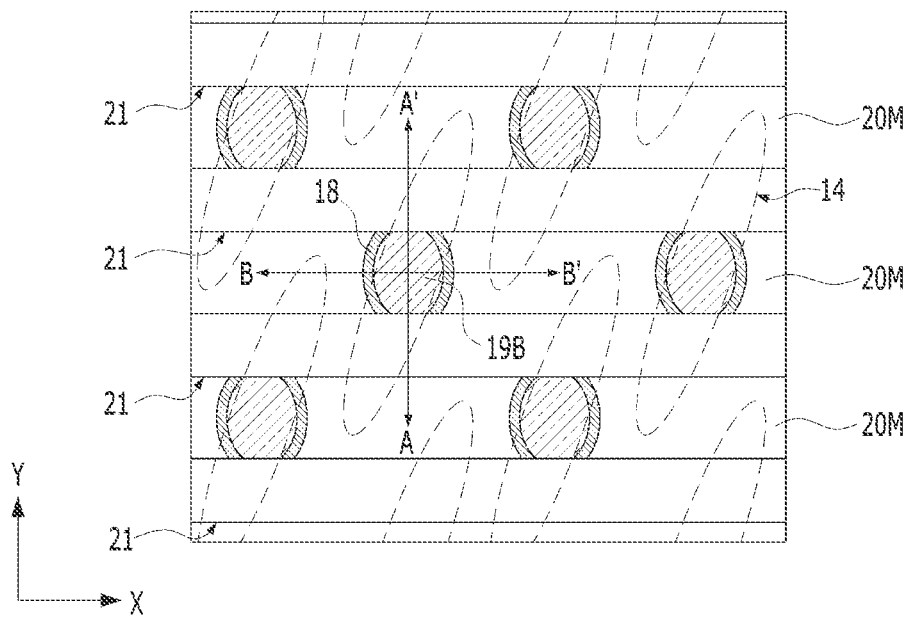
Figure 3G:
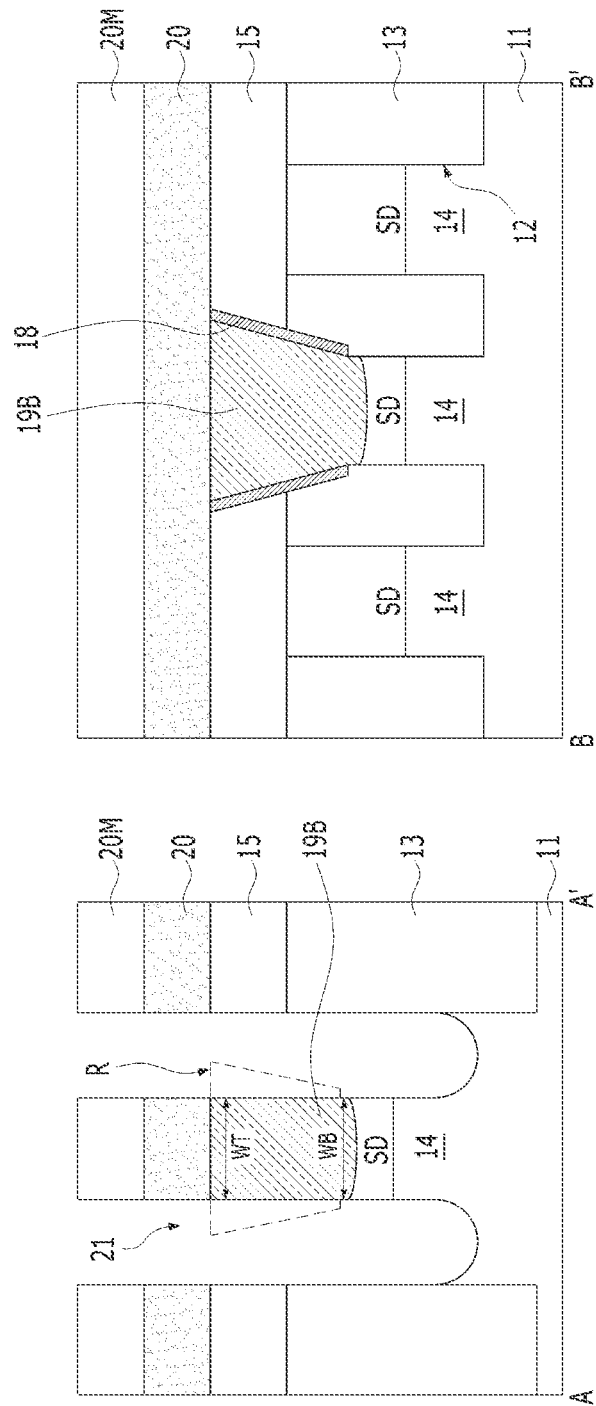

Referring to FIGS. 2G and 3G, a trench mask pattern 20M may be formed on and may contact the trench hard mask layer 20A. The trench mask pattern 20M may be formed by a known photolithography process. The trench mask pattern 20M may include a hard mask pattern patterned by a photoresist pattern. The trench mask pattern 20M may include a line-type mask.

The trench hard mask layer 20A may be etched using the trench mask pattern 20M as an etch mask. A trench hard mask 20 may be formed by etching the trench hard mask layer 20A. A portion of the inter-layer insulation layer 15 and a portion of the substrate 11 may be etched using the trench hard mask 20 as an etch mask. A trench 21 may be formed by etching a portion of the inter-layer insulation layer 15 and a portion of the substrate 11. The trench 21 may be referred to as a 'gate trench.' The trench 21 may have a line shape that crosses the active area 14 and the element isolation layer 13. There may be formed a plurality of trenches 21 spaced apart from each other.

The trenches 21 may be self-aligned with the side surfaces of the contact plug 19B. The trenches 21 may be self-aligned with the exposed side walls of the contact plug 19B. The side wall of the contact plug 19B may abut the trench 21. As the trench 21 is formed, a portion of the side wall of the contact plug 19B may be exposed.

The bottom surface of the trench 21 may be at a lower level than the bottom surface of the contact plug 19B. The bottom surface of the trench 21 may be at a higher level than the bottom surface of the element isolation layer 13. The side wall of the trench 21 may abut the source/drain area SD. The bottom surface of the source/drain area SD may be higher than the bottom surface of the trench 21. The trench 21 may include an upper area provided by etching the inter-layer insulation layer 15 and a lower area provided by etching the substrate 11, and the lower area may have a larger depth than the upper area. The trench 21 may have a depth sufficient to increase the average cross-sectional area of the subsequent gate electrode. Accordingly, the resistance of the gate electrode may be reduced. Although not shown, a portion of the element isolation layer 13 may be recessed, allowing the top portion of the active area 14 under the trench 21 to protrude. For example, the element isolation layer 13 under the trench 21 may be optionally recessed. Accordingly, a fin region may be formed under the trench 21. The fin region may be part of a channel area.

As the trench 21 is formed, a portion of the plug material 19A may be removed (R). The trench 21 may etch both the side walls of the plug material 19A. As the plug material 19A is etched, the contact plug 19B may be formed. That is, the contact plug 19B may be formed simultaneously with the formation of the trench 21. The contact plug 19B may be formed between trenches 21. The contact plug 19B may penetrate the inter-layer insulation layer 15. The contact plug 19B may be formed in the substrate 11. The contact plug 19B may pass through the inter-layer insulation layer 15 and extend to the inside of the substrate 11. The contact plug 19B may be referred to as a 'buried plug.' The contact plug 19B may include a lower portion extending to the inside of the substrate 11 and an upper portion penetrating the inter-layer insulation layer 15. The lower portion of the contact plug 19B may have a larger depth than the upper portion thereof. Namely, the depth of the portion extending to the inside of the substrate 11 in the contact plug 19B may be larger than the depth of the portion penetrating the inter-layer insulation layer 15. The contact plug 19B may be buried in the substrate 11.

From a top view, the contact plug 19B may be shaped as an oval or circle broken between two facing surfaces. The width WT of the top portion of the contact plug 19B may be identical to the width WB of the bottom portion. A cross section of the contact plug 19B may have a vertical shape. A cross section of the contact plug 19B may have a sloped shape. The exposed side wall of the contact plug 19B may include a straight profile. The non-exposed side wall of the contact plug 19B may include a curved or round profile.

As the trench 21 is formed, a portion of the preliminary spacer 18A may be removed (R). The trench 21 may etch a portion of the preliminary spacer 18A. As the preliminary spacer 18A is etched, the plug spacer 18 may be formed. The plug spacer 18 may be formed as the preliminary spacer 18A is cut. The plug spacer 18 may cover the non-exposed side wall of the contact plug 19B. The plug spacer 18 may surround a portion of the outer wall of the contact plug 19B. The plug spacer 18 may not overlap the trench 21. The top view of the plug spacer 18 may have a discontinuous ring shape. The top view of the plug spacer 18 may be shaped as curved or round shapes facing each other. A cross section of the plug spacer 18 may have a sloped shape. The plug spacer 18 may discontinuously surround the lower outer wall of the contact plug 19B. The plug spacer 18 may be positioned between trenches 21.

Figure 2H:
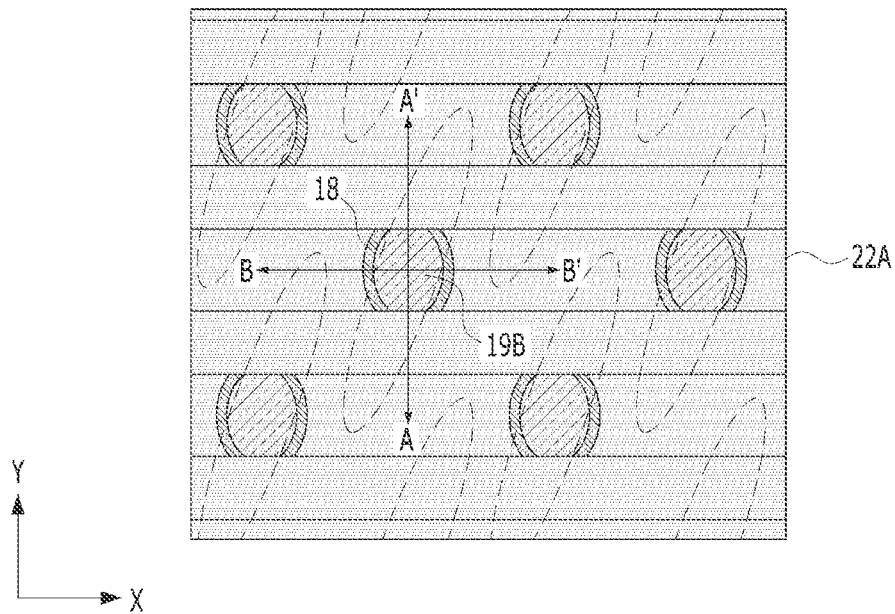
Figure 3H:
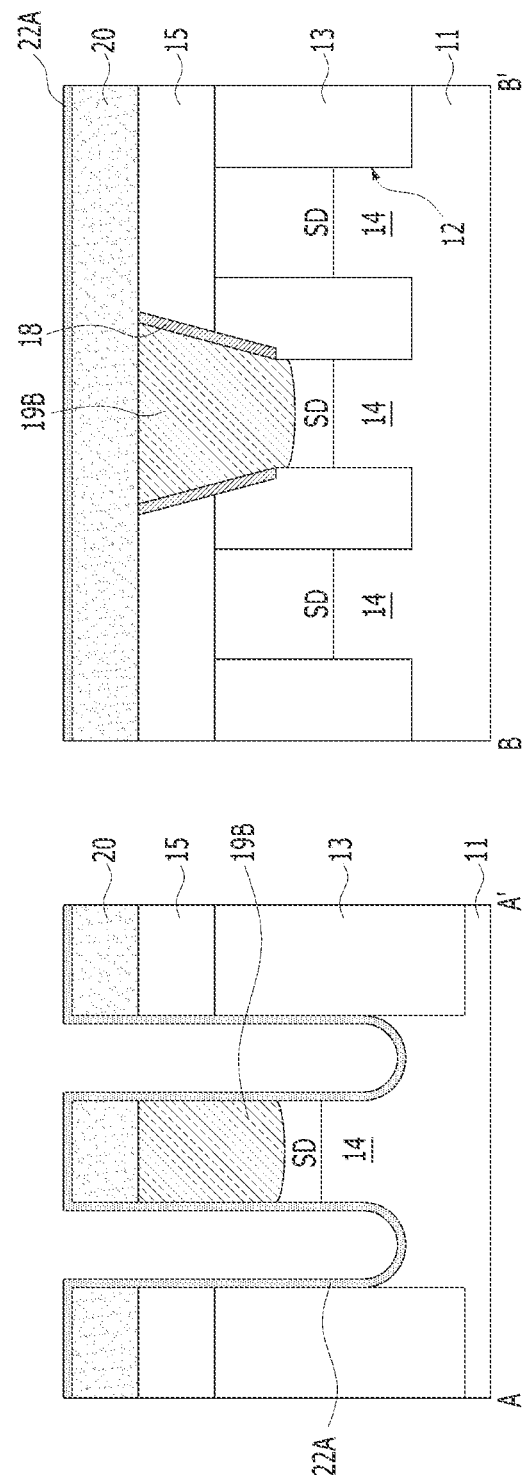

Referring to FIGS. 2H and 3H, a preliminary gate insulation layer 22A may be formed on and in direct contact with the bottom surface and side walls of the trench 21. The preliminary gate insulation layer 22A may be formed on and in direct contact with the exposed side wall of the contact plug 19B. The preliminary gate insulation layer 22A may be formed on and in direct contact with the surface of the trench 21. Before forming the preliminary gate insulation layer 22A, etch damage to the surface of the trench 21 may be cured. For example, a sacrificial oxide may be formed by thermal oxidation and may then be removed.

The preliminary gate insulation layer 22A may be formed by depositing an oxide film or a nitride film. The preliminary gate insulation layer 22A may be formed on and may directly contact the bottom surface and side wall of the trench 21. The preliminary gate insulation layer 22A may be formed on and may directly contact the side wall of the inter-layer insulation layer 15, exposed by the trench 21. The preliminary gate insulation layer 22A may be formed on and may directly contact the side wall of the contact plug 19B, exposed by the trench 21. The preliminary gate insulation layer 22A may be formed on and may directly contact the top surface and side wall of the trench hard mask 20, exposed by the trench 21. Accordingly, the preliminary gate insulation layer 22A may cover the trench 21, inter-layer insulation layer 15, contact plug 19B, and trench hard mask 20. The preliminary gate insulation layer 22A may be formed by a deposition method, such as, for example, chemical vapor deposition (CVD) or atomic layer deposition (ALD).

According to an embodiment, the preliminary gate insulation layer 22A may be formed by oxidation. For example, the preliminary gate insulation layer 22A may be formed by thermal oxidation. According to an embodiment, the preliminary gate insulation layer 22A may be formed by oxidating the side walls of the contact plug 19B and the surface of the trench 21. The preliminary gate insulation layer 22A may be formed by oxidating the substrate 11 exposed by the trench 21. The preliminary gate insulation layer 22A may be formed by oxidating the side walls of the contact plug 19B, exposed by the trench 21. The preliminary gate insulation layer 22A may be formed by oxidating the side wall of the inter-layer insulation layer 15, exposed by the trench 21. The preliminary gate insulation layer 22A may be formed by oxidating the top surface and side wall of the trench hard mask 20, exposed by the trench 21. The oxide film formed on the top surface and the side wall of the trench hard mask 20, exposed by the trench 21, may be smaller in thickness than the oxide film formed on the side wall of the inter-layer insulation layer 15. No oxide film may be formed on the top surface and side wall of the trench hard mask 20 exposed by the trench 21. Accordingly, the preliminary gate insulation layer 22A may cover the trench 21, the side wall of the inter-layer insulation layer 15, and the side wall of the contact plug 19B.

The preliminary gate insulation layer 22A may include, for example, silicon oxide, silicon nitride, silicon oxynitride, a high-k material, or a combination thereof. The high-k material may include a material having a larger dielectric constant than the dielectric constant of silicon oxide. The high-k material may include at least one metallic element. The high-k material may include a hafnium-containing material. The hafnium-containing material may include hafnium oxide, hafnium silicon oxide, hafnium silicon oxynitride, or a combination thereof. According to an embodiment, the high-k material may include lanthanum oxide, lanthanum aluminum oxide, zirconium oxide, zirconium silicon oxide, zirconium silicon oxynitride, aluminum oxide, or a combination thereof. As the high-k material, other known high-k materials may be optionally used.

Figure 2I:
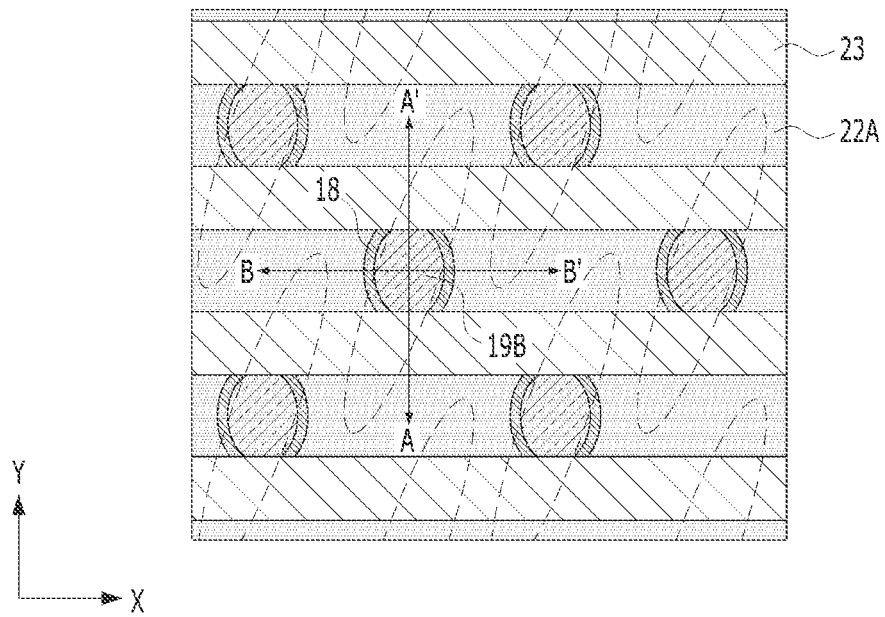
Figure 3I:
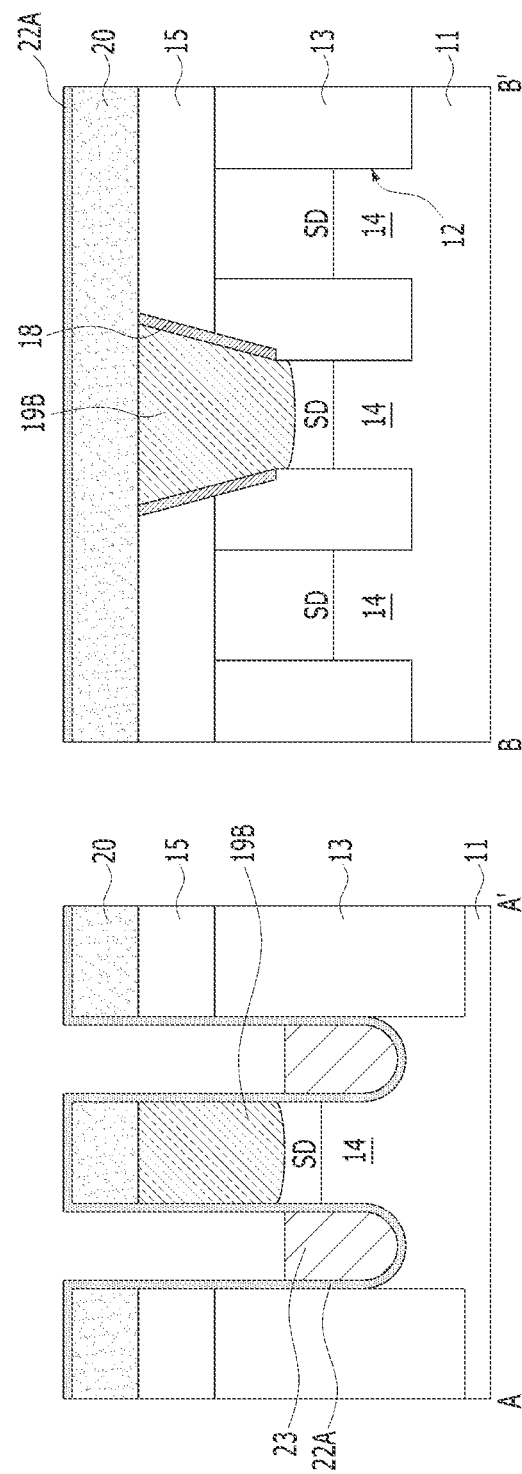

Referring to FIGS. 2I and 3I, a gate electrode 23 may be formed on and may directly contact the preliminary gate insulation layer 22A. To form the gate electrode 23, a conductive layer (not shown) may be formed to fill the trench 21, and then, a recessing process may be performed. As the recessing process, an etchback process may be performed, or a chemical mechanical polishing (CMP) process and an etchback process may sequentially be performed. The gate electrode 23 may partially fill the trench 21. Accordingly, the gate electrode 23 may be referred to as a 'buried gate electrode' or 'buried word line.' The top surface of the gate electrode 23 may be at a lower level than the bottom surface of the contact plug 19B. The top surface of the gate electrode 23 may be at the same level as the bottom surface of the contact plug 19B.

The gate electrode 23 may include a metal, metal nitride, or a combination thereof. For example, the gate electrode 23 may be formed of titanium nitride (TIN), tungsten (W), or titanium nitride/tungsten (TiN/W). The titanium nitride/tungsten (TiN/W) may have a structure which results from conformally forming titanium nitride and then partially filling the trench 21 with tungsten. As the gate electrode 23, titanium nitride alone may be used, which may be referred to as a "TiN Only" structure of gate electrode 23. The gate electrode 23 may include a tungsten-containing material that includes tungsten as a main element.

Subsequently, a doping process may be optionally performed. The doping process may include, e.g., implantation or plasma doping (PLAD).

Figure 2J:
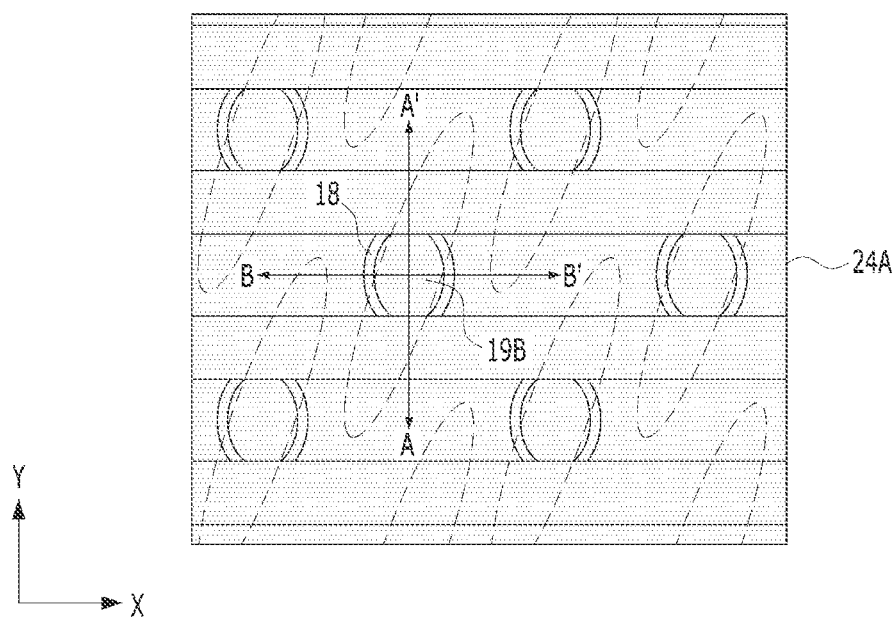
Figure 3J:
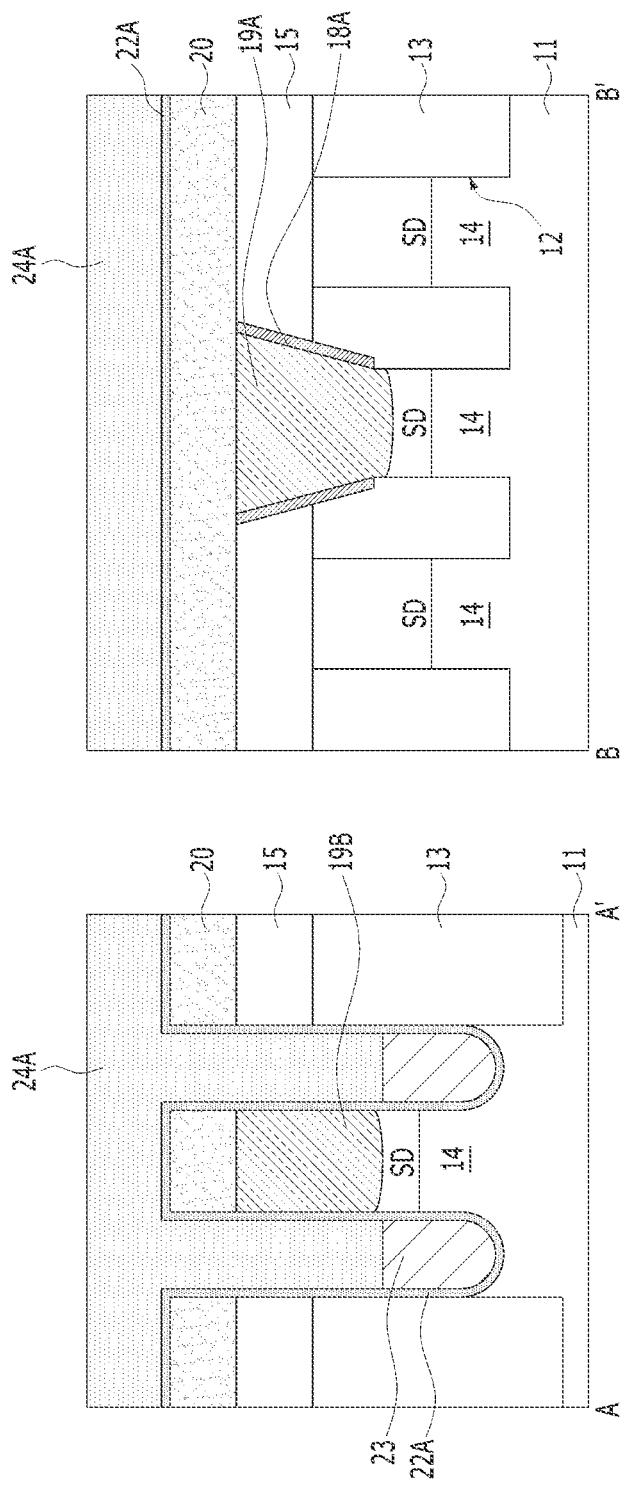

Referring to FIGS. 2J and 3J, a preliminary gate capping layer 24A may be formed on and may directly contact the gate electrode 23. The rest of the trench 21 may be filled with the preliminary gate capping layer 24A. The preliminary gate capping layer 24A may cover the preliminary gate insulation layer 22A.

The preliminary gate capping layer 24A includes an insulation material. The preliminary gate capping layer 24A may include, for example, silicon nitride. According to an embodiment, the preliminary gate capping layer 24A may include, for example, silicon oxide. The preliminary gate capping layer 24A may have a multi-layer structure. The preliminary gate capping layer 24A may include one or more layers. The preliminary gate capping layer 24A may have a multi-layer nitride-oxide-nitride (NON) structure.

Figure 2K:
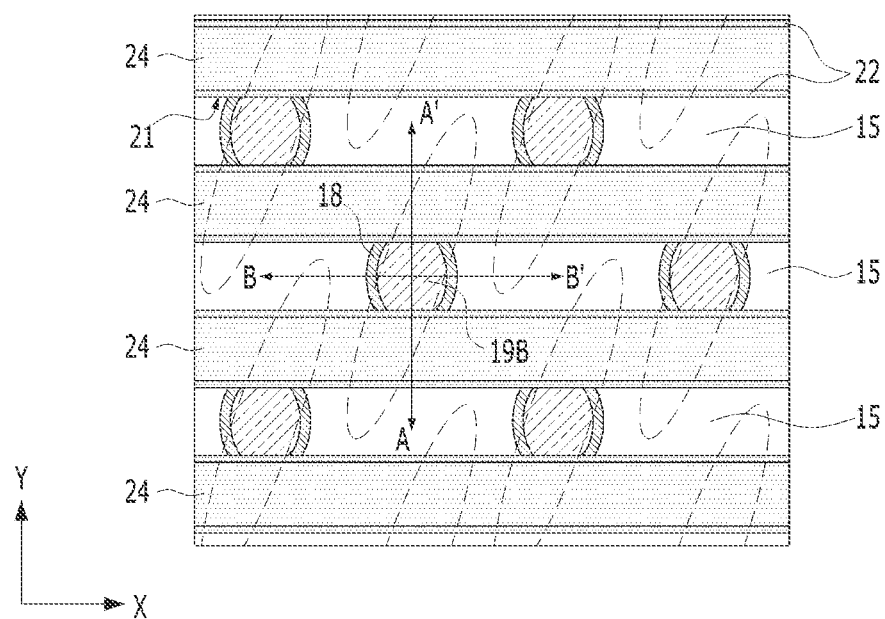
Figure 3K:
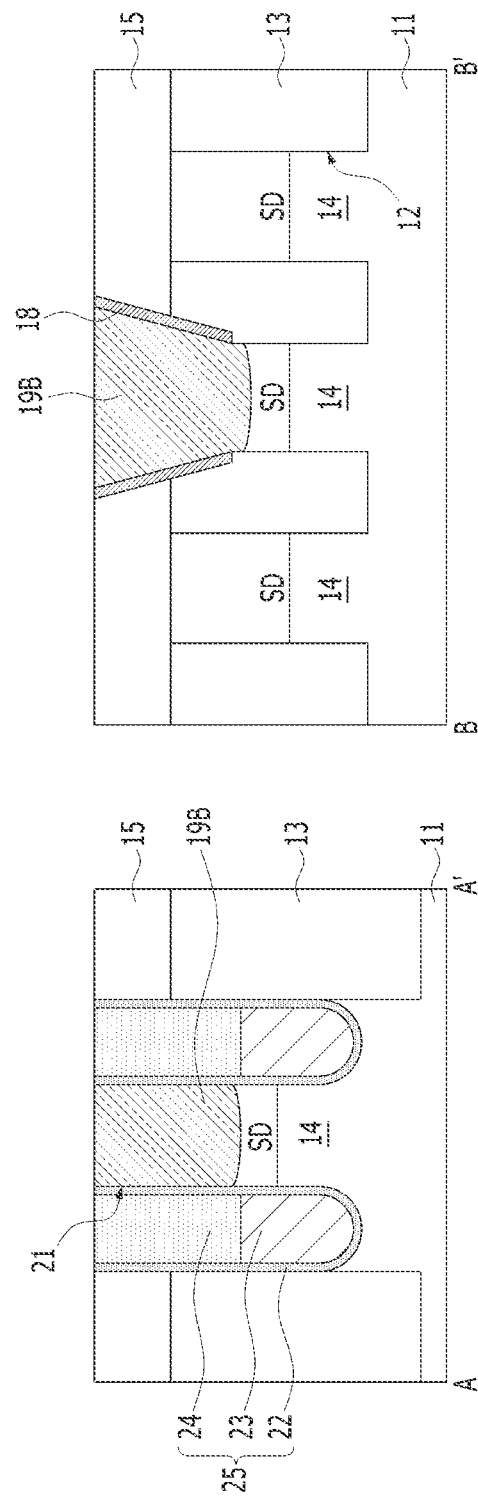

Referring to FIGS. 2K and 3K, a gate capping layer 24 may be formed in the trench 21. The top surface of the gate capping layer 24 may be at the same level as the top surface of the inter-layer insulation layer 15. To that end, chemical mechanical polishing (CMP) may be performed upon forming the gate capping layer 24. The gate capping layer 24 may be formed via an etching process using a separate mask. During this course, the trench hard mask 20, preliminary gate insulation layer 22A, and preliminary gate capping layer 24A, positioned on the top surface of the contact plug 19B and the inter-layer insulation layer 15 may be removed. Accordingly, the top surface of the inter-layer insulation layer 15 may be exposed. As a portion of the preliminary gate insulation layer 22A is removed, a gate insulation layer 22 may be formed inside the trench 21.

The gate insulation layer 22 may be formed on and may contact the surface of the trench 21, the side wall of the contact plug 19B, and the side wall of the inter-layer insulation layer 15. The gate insulation layer 22 may include a first oxide which is the oxide of the side wall of the contact plug 19B. The gate insulation layer 22 may include a second oxide which is the oxide of the surface of the substrate 11 exposed by the trench 21. The gate insulation layer 22 may include a third oxide which is the oxide of the side wall of the contact plug 19B exposed by the trench 21. The first oxide, the second oxide, and the third oxide may be continuous. The first oxide, the second oxide, and the third oxide may include the same material. The first oxide, the second oxide, and the third oxide may include, for example, silicon oxide. The gate insulation layer 22 may extend to be positioned between the gate capping layer 24 and the contact plug 19B.

The gate insulation layer 22, the gate electrode 23, and the gate capping layer 24 may form a gate structure 25. The gate structure 25 may be formed in the trench 21. The gate structure 25 may extend in a line shape. The contact plug 19B may be positioned between gate structures 25. The gate structure 25 may be referred to as a 'buried gate structure.'

According to the above-described embodiment, the process difficulty in forming the contact plug 19B may be reduced by forming the contact plug 19B earlier than the gate electrode 23. Further, a short defect between the contact plug 19B and the gate electrode 23 may be mitigated by forming the gate insulation layer 22 on the side wall of the contact plug 19B.

Figure 4A:
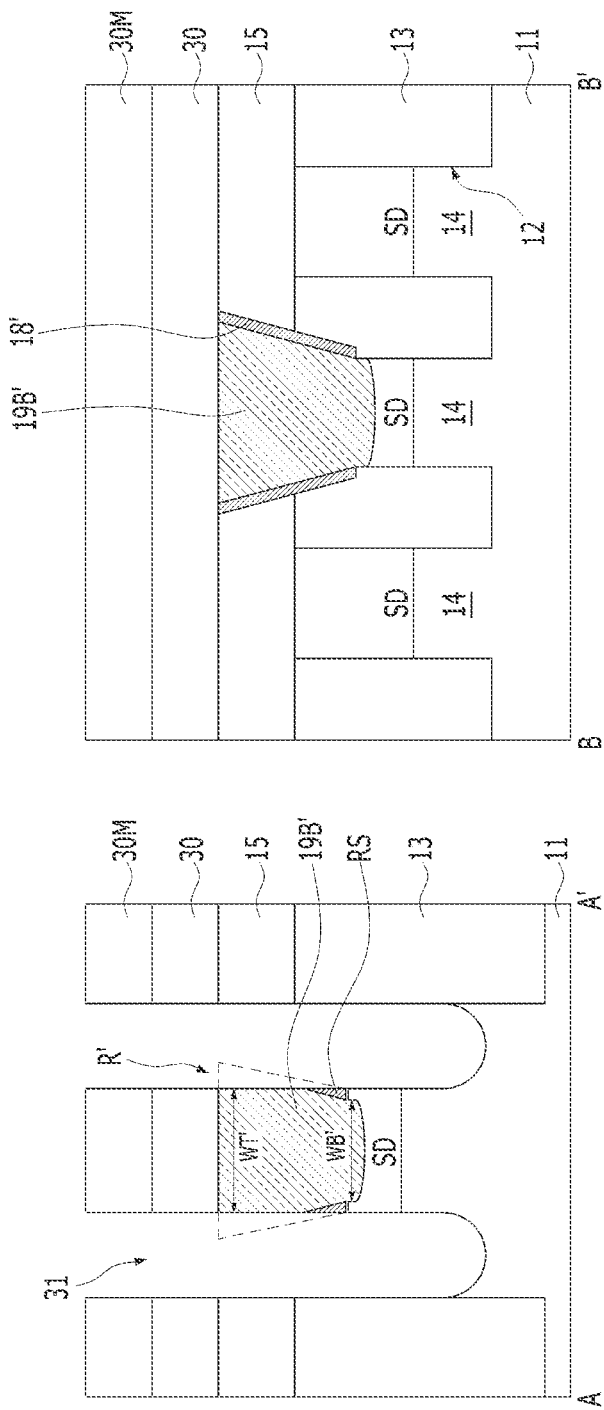
FIGS. 4A, 4B, 4C, 4D, and 4E are views illustrating a method for manufacturing a semiconductor device according to an embodiment of the present disclosure.
Figure 4B:
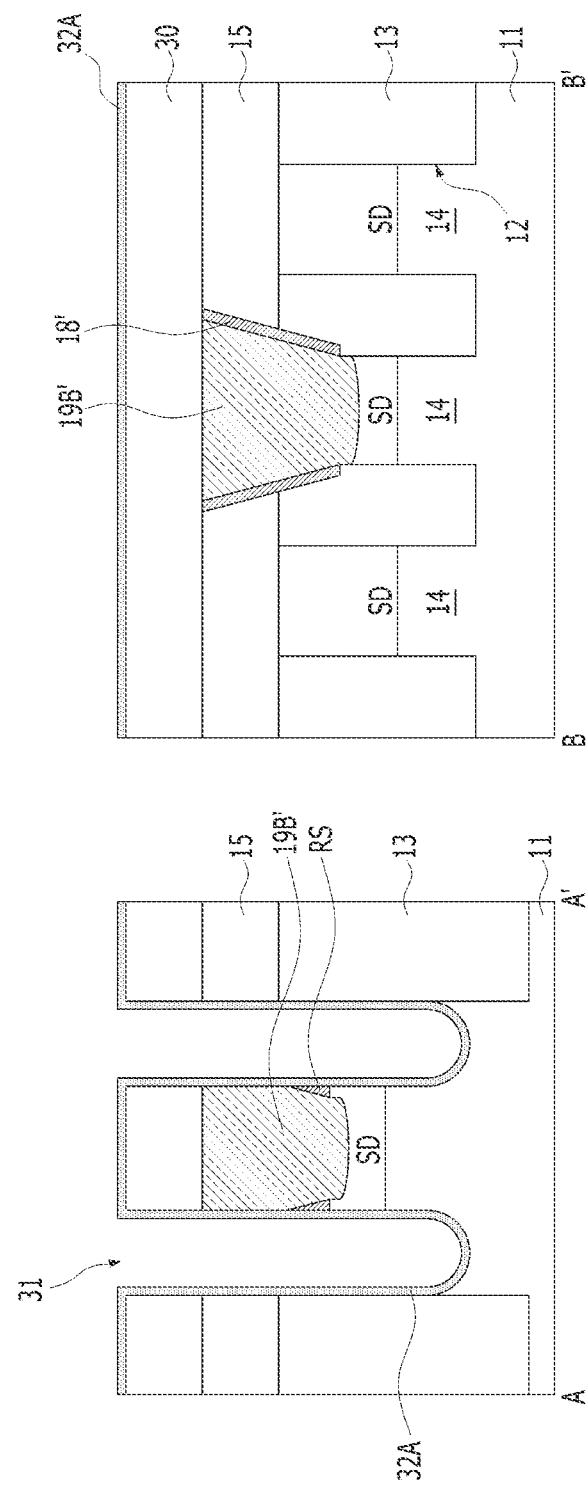
Figure 4C:
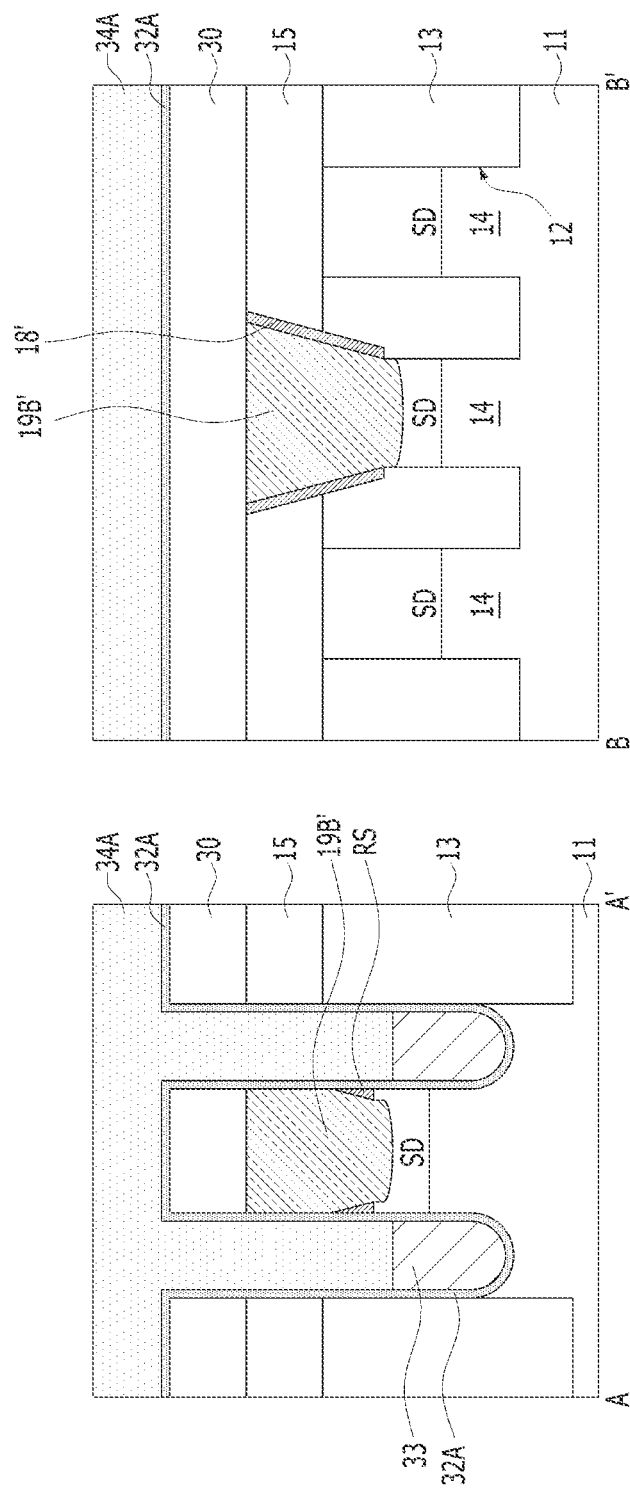
Figure 4D:
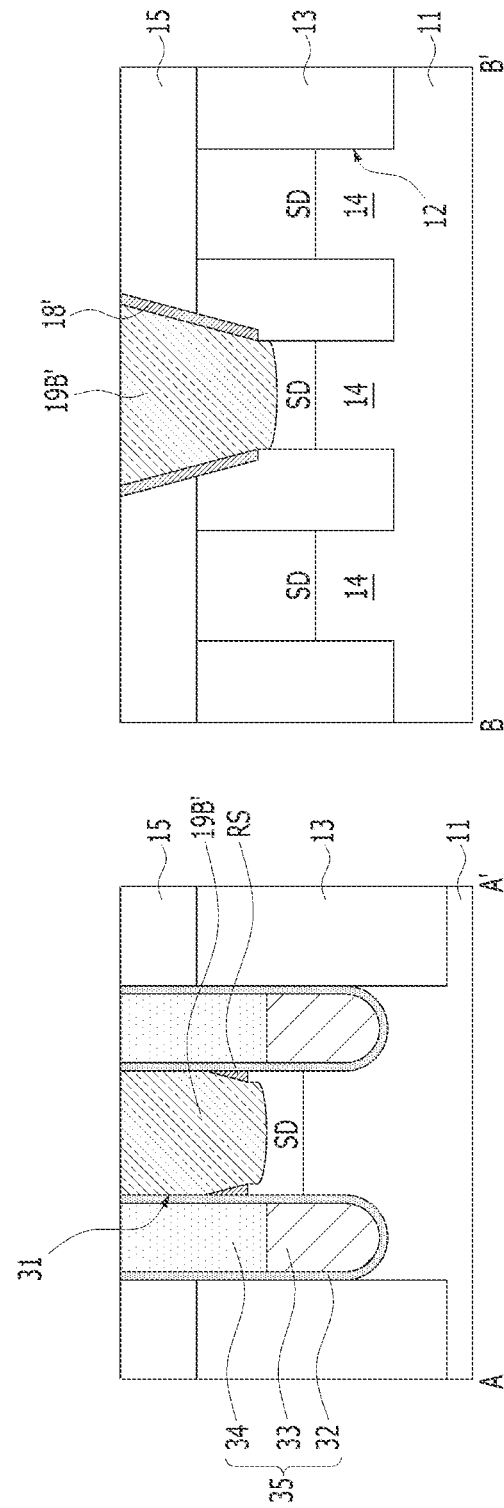
Figure 4E:
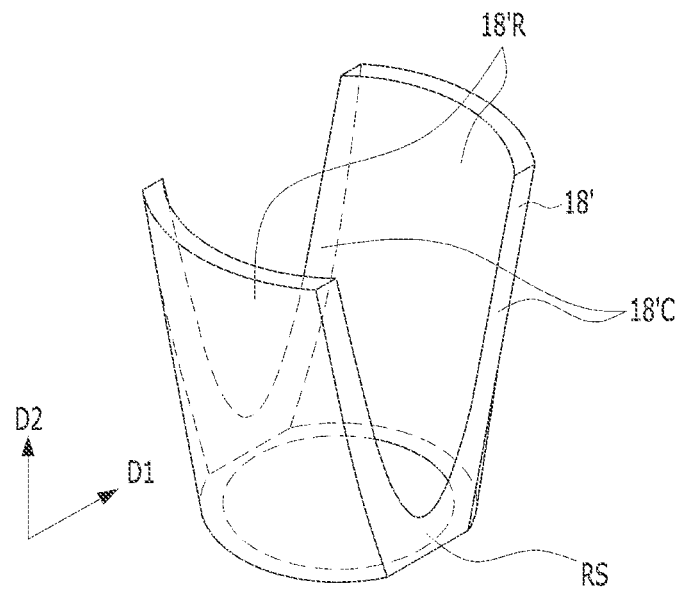

FIGS. 4A to 4E are views illustrating a semiconductor device according to an embodiment of the present disclosure. FIGS. 4A to 4D are cross-sectional views illustrating a method for manufacturing a semiconductor device according to an embodiment of the present disclosure. FIG. 4E is a perspective view illustrating a plug spacer 18'.

First, the preliminary spacer 18A and the plug material 19A may be formed in the contact hole 17 by the method illustrated in FIGS. 2A to 2F and FIGS. 3A to 3F. In FIGS. 4A to 4D, the same reference numbers are used to denote the same elements as those in FIGS. 3A to 3F. Detailed description of duplicate elements may be omitted.

Referring to FIGS. 4A to 4D, a semiconductor device 200 may be similar to the semiconductor device 100 of FIG. 1B.

Referring to FIG. 4A, a trench hard mask 30 may be formed on and may contact the substrate 11. A trench mask pattern 30M may be formed on and may contact the trench hard mask 30. The trench mask pattern 30M may be formed by a known photolithography process. The trench mask pattern 30M may include a hard mask pattern patterned by a photoresist pattern.

A trench hard mask layer (not shown) may be etched using the trench mask pattern 30M as an etch mask. A trench hard mask 30 may be formed by etching the trench hard mask layer (not shown).

The trench hard mask 30 may have a multi-layer structure. The trench hard mask 30 may include one or more layers. The height of the trench hard mask 30 may be larger than the height of the inter-layer insulation layer 15. The trench hard mask 30 may include, for example, silicon oxide, silicon nitride, silicon oxynitride, or a combination thereof. According to an embodiment, the trench hard mask 30 may be formed of silicon nitride. The trench hard mask 30 may be formed by the same method given for the trench hard mask 20 of FIG. 3G.

A trench 31 may be formed using the trench hard mask 30 as an etch mask. The trench 31 may be referred to as a 'gate trench.' Part of the plug material 19A and inter-layer insulation layer 15 and the substrate 11 may be etched using the trench hard mask 30 as an etch mask. Thus, the trench 31 may be formed.

As the trench 31 is formed, a portion of the substrate 11 may be exposed. The top view of FIG. 4A may be the same as FIG. 2G. The trench 31 may have a line shape that crosses the active area 14 and the element isolation layer 13. The bottom surface of the trench 31 may be at a higher level than the bottom surface of the element isolation layer 13. The trench 31 may have a smaller depth than the element isolation layer 13. The side wall of the trench 31 may abut the source/drain area SD. The bottom surface of the source/drain area SD may be higher than the bottom surface of the trench 31. The trench 31 may include an upper area provided by etching the inter-layer insulation layer 15 and a lower area provided by etching the substrate 11, and the lower area may have a larger depth than the upper area. The trench 31 may have a depth sufficient to increase the average cross-sectional area of the subsequent gate electrode. Accordingly, the resistance of the gate may be reduced. A fin region may be formed under the trench 31.

As the trench 31 is formed, a portion of the plug material 19A may be removed (R'). As the trench 31 is formed, both the side walls of the plug material 19A may be etched. The contact plug 19B' may be formed by etching the plug material 19A. That is, the contact plug 19B' may be formed simultaneously with the formation of the trench 31.

The contact plug 106 may be formed between trenches 31. The contact plug 19B' may penetrate the inter-layer insulation layer 15. The contact plug 19B' may be formed in the substrate 11. The contact plug 19B' may pass through the inter-layer insulation layer 15 and extend to the inside of the substrate 11. The contact plug 19B' may be referred to as a 'buried plug.' The contact plug 19B' may include a lower portion extending to the inside of the substrate 11 and an upper portion penetrating the inter-layer insulation layer 15. The lower portion of the contact plug 19B' may have a larger depth than the upper portion thereof. Namely, the depth of the portion extending to the inside of the substrate 11 in the contact plug 19B' may be larger than the depth of the portion penetrating the inter-layer insulation layer 15. The contact plug 19B' may be buried in the substrate 11.

The side wall of the contact plug 19B' may abut the trench 31. The trenches 31 may be self-aligned with the side walls of the contact plug 19B'. The trenches 31 may be self-aligned with the exposed side walls of the contact plug 19B'. From a top view, the contact plug 19B' may be shaped as an oval or circle broken between two facing surfaces. The width WT' of the top portion of the contact plug 19B' may be larger than the width WB' of the bottom portion. A cross section of the contact plug 19B' may have a sloped shape. The exposed side wall of the contact plug 19B' may include a straight profile. The non-exposed side wall of the contact plug 19B' may include a round profile.

As the trench 31 is formed, a portion of the preliminary spacer 18A may be removed (R'). As the preliminary spacer 18A is etched, the plug spacer 18' may be formed. The plug spacer 18' may be formed as the preliminary spacer 18A is cut. The plug spacer 18' may cover the non-exposed side wall of the contact plug 19B'. The plug spacer 18' may include a shape surrounding the outer wall of the contact plug 19B'. The plug spacer 18' may not overlap the trench 31.

The top view of the plug spacer 18' may have a discontinuous ring shape. The top view of the plug spacer 18' may be shaped as curved or round shapes facing each other. The top view of the lower cross section of the plug spacer 18' may have a ring shape. The circumference of the plug spacer 18' may reduce from the top portion to the bottom portion. A cross section of the plug spacer 18' may have a sloped shape. The plug spacer 18' may have a continuous ring shape and a continuous ring shape from the top portion to the bottom portion. The plug spacer 18' may be positioned between trenches 31. The plug spacer 18' may not overlap the trenches 31.

The plug spacer 18' positioned on the lower outer wall of the contact plug 19B' may be referred to as a bottom spacer RS. The plug spacer 18' may include the bottom spacer RS. The bottom spacer RS may be positioned on the lower outer wall of the contact plug 19B'. The bottom spacer RS may be formed in an area which is narrower than the width WT' of the top portion of the contact plug 19B' and is wider than the width WB' of the bottom portion. The bottom spacer RS may be formed between the contact plug 19B' and the trench 31. The bottom spacer RS may be formed between the bottom edge of the contact plug 19B' and the trench 31. The bottom spacer RS may be connected with the plug spacer 18'. The bottom spacer RS may have a shape surrounding the lower outer wall of the contact plug 19B'. From a top view, the bottom spacer RS may have a ring shape.

Referring to FIG. 4B, a preliminary gate insulation layer 32A may be formed on and may directly contact the bottom surface and side walls of the trench 31. The top view of FIG. 4B may be identical to that of FIG. 2H. The preliminary gate insulation layer 32A may be formed on and may directly contact the exposed side wall of the contact plug 19B'. The preliminary gate insulation layer 32A may be formed on and may directly contact the surface of the trench 31. Before forming the preliminary gate insulation layer 32A, etch damage to the surface of the trench 31 may be cured. For example, a sacrificial oxide may be formed by thermal oxidation and may then be removed.

The preliminary gate insulation layer 32A may be formed by depositing an oxide film. The preliminary gate insulation layer 32A may be formed on and may directly contact the bottom surface and side wall of the trench 31. The preliminary gate insulation layer 32A may be formed on and may directly contact the side wall of the inter-layer insulation layer 15, exposed by the trench 31. The preliminary gate insulation layer 32A may be formed on and may directly contact the side wall of the contact plug 19B', exposed by the trench 31. The preliminary gate insulation layer 32A may be formed on and may directly contact the side wall of the bottom spacer RS, exposed by the trench 31. The preliminary gate insulation layer 32A may be formed on and may directly contact the top surface and side wall of the trench hard mask 30 exposed by the trench 31. Accordingly, the preliminary gate insulation layer 32A may cover the trench 31, inter-layer insulation layer 15, bottom spacer RS, contact plug 19B', and trench hard mask 30. The preliminary gate insulation layer 32A may be formed by a deposition method, such as chemical vapor deposition (CVD) or atomic layer deposition (ALD).

According to an embodiment, the preliminary gate insulation layer 32A may be formed by oxidation. The preliminary gate insulation layer 32A may be formed by thermal oxidation. According to an embodiment, the preliminary gate insulation layer 32A may be formed by oxidating the bottom surface and side walls of the trench 31. According to an embodiment, the preliminary gate insulation layer 32A may be formed by oxidating the bottom surface and side walls of the trench 31. The preliminary gate insulation layer 32A may be formed by oxidating the exposed side walls of the contact plug 19B'. The preliminary gate insulation layer 32A may be formed by oxidating the side wall of the inter-layer insulation layer 15, exposed by the trench 31. The preliminary gate insulation layer 32A may be formed by oxidating the contact plug 19B' exposed by the trench 31. The preliminary gate insulation layer 32A may be formed by oxidating the side wall of the bottom spacer RS exposed by the trench 31. The oxide film formed on the top surface and the side wall of the trench hard mask 30, exposed by the trench 31, may be smaller in thickness than the oxide film formed on the side wall of the inter-layer insulation layer 15. No oxide film may be formed on the top surface and side wall of the trench hard mask 30 exposed by the trench 31. Accordingly, the preliminary gate insulation layer 32A may cover the trench 31, the side wall of the inter-layer insulation layer 15, and the side wall of the contact plug 19B'.

The preliminary gate insulation layer 32A may include, for example, silicon oxide, silicon nitride, silicon oxynitride, a high-k material, or a combination thereof. The high-k material may include a material having a larger dielectric constant than the dielectric constant of silicon oxide. The high-k material may include a hafnium-containing material. The hafnium-containing material may include hafnium oxide, hafnium silicon oxide, hafnium silicon oxynitride, or a combination thereof. According to an embodiment, the high-k material may include lanthanum oxide, lanthanum aluminum oxide, zirconium oxide, zirconium silicon oxide, zirconium silicon oxynitride, aluminum oxide, or a combination thereof. As the high-k material, other known high-k materials may be optionally used.

Referring to FIG. 4C, a gate electrode 33 may be formed on and may directly contact the preliminary gate insulation layer 32A. The top view of FIG. 4C may be the same as FIG. 23. To form the gate electrode 33, a conductive layer (not shown) may be formed to fill the trench 31, and then, a recessing process may be performed. As the recessing process, an etchback process may be performed, or a chemical mechanical polishing (CMP) process and an etchback process may sequentially be performed. The gate electrode 33 may have a recessed shape meaning that it is only partially filling the trench 31. The top surface of the gate electrode 33 may be at a lower level than the bottom surface of the contact plug 19B'.

The gate electrode 33 may include a metal, metal nitride, or a combination thereof. For example, the gate electrode 33 may be formed of titanium nitride (TiN), tungsten (W), or titanium nitride/tungsten (TiN/W). The titanium nitride/tungsten (TiN/W) may have a structure which results from conformally forming titanium nitride and then partially filling the trench 31 with tungsten. As the gate electrode 33, titanium nitride alone may be used, which may be referred to as a "TiN Only" structure of gate electrode 33. The gate electrode 33 may include a tungsten-containing material that includes tungsten as a main element.

Subsequently, a doping process may be optionally performed. The doping process may include, e.g., implantation or plasma doping (PLAD).

A preliminary gate capping layer 34A may be formed on and may directly contact the gate electrode 33. The remainder of the trench 31 above the gate electrode 33 may be filled with the preliminary gate capping layer 34A. The preliminary gate capping layer 34A may cover the preliminary gate insulation layer 32A and the gate electrode 33. The preliminary gate capping layer 34A includes an insulation material. The preliminary gate capping layer 34A may include, for example, silicon nitride. According to an embodiment, the preliminary gate capping layer 34A may include, for example, silicon oxide. The preliminary gate capping layer 34A may have a multi-layer structure. The preliminary gate capping layer 34A may include one or more layers. The preliminary gate capping layer 34A may have a multi-layer nitride-oxide-nitride (NON) structure.

Referring to FIG. 4D, a gate capping layer 34 may be formed in the trench 31. The top view of FIG. 4D may be the same as FIG. 2K. The top surface of the gate capping layer 34 may be at the same level as the top surface of the inter-layer insulation layer 15. To that end, chemical mechanical polishing (CMP) may be performed upon forming the gate capping layer 34. The gate capping layer 34 may be formed via an etching process using a separate mask. During this course, the trench hard mask 30, preliminary gate insulation layer 32A, and preliminary gate capping layer 34A, positioned on the top surface of the contact plug 19B' and the inter-layer insulation layer 15 may be removed. Accordingly, the top surface of the inter-layer insulation layer 15 may be exposed.

As a portion of the preliminary gate insulation layer 32A is removed, a gate insulation layer 32 may be formed inside the trench 31. The gate insulation layer 32, the gate electrode 33, and the gate capping layer 34 may form a gate structure 35. The gate structure 35 may be formed in the trench 31. The gate structure 35 may extend in a line shape. The gate structure 35 may be referred to as a 'buried gate structure.'

The gate insulation layer 32 may be formed on and may directly contact the surface of the trench 31 and the side wall of the inter-layer insulation layer 15. The gate insulation layer 32 may be formed on and may directly contact the side wall of the contact plug 19B'. The gate insulation layer 32 may be formed between the contact plug 19B' and the gate capping layer 34.

Referring to FIG. 4E, the plug spacer 18' may include a curved or round outer wall 18'R. The curved or round outer wall 18'R may include a curved or round shape. The plug spacer 18' may include parallel cut surfaces 18'C. The curved or round outer wall 18'R and the parallel cut surfaces 18'C may be continuous. The top view of the curved or round outer wall 18'R may form symmetry.

The top view of the cross section in the D1 direction of the plug spacer 18' at a higher level may have a discontinuous ring shape. The top view of the cross section in the D1 direction of the plug spacer 18' at a higher level may have round shapes facing each other. The circumference of the plug spacer 18' may decrease from the higher level to the lower level. Accordingly, a cross section in the D2 direction of the plug spacer 18' may have a sloped shape. The top view of the cross section in the D1 direction of the plug spacer 18' at a higher level may have a ring shape.

The plug spacer 18' may include the bottom spacer RS. The bottom spacer RS may be connected with the plug spacer 18'. The bottom spacer RS may be positioned at a lower level of the plug spacer 18'. The bottom spacer RS may partially include parallel cut surfaces and have a continuous shape. The circumference of the bottom spacer RS may decrease from the higher level to the lower level. The bottom spacer RS may include a ring shape whose circumference decreases from the higher level to the lower level. The bottom spacer RS at the higher level may be thinned by the cut surfaces. Thus, the thickness of the bottom spacer RS may increase from the higher level to the lower level. The thickness of the bottom spacer RS at the lower level may be identical to the thickness of the plug spacer 18'.

According to the above-described embodiment, the process difficulty in forming the contact plug 19B' may be reduced by forming the contact plug 19B' earlier than the gate electrode 33. Further, a short defect between the contact plug 19B' and the gate electrode 33 may be mitigated by forming the gate insulation layer 32 on the side wall of the contact plug 19B'. The short defect between the contact plug 19B' and the gate electrode 33 may be further mitigated by forming the bottom spacer RS on the lower outer wall of the contact plug 19B'.

Figure 5:
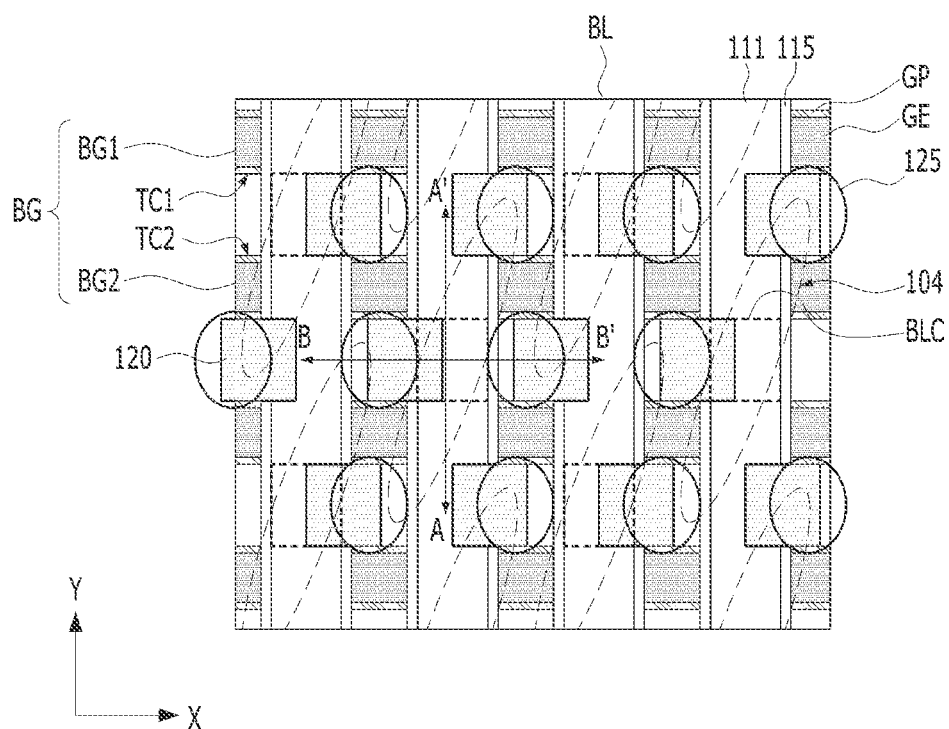
FIG. 5 is a top view illustrating a semiconductor device according to an embodiment of the present disclosure.

FIG. 5 is a cross-sectional view illustrating a top view of a semiconductor device 300 according to an embodiment of the present disclosure.

The semiconductor device 300 may include a plurality of memory cells. Each memory cell may include an active area 104, an element isolation layer (not shown), a gate structure BG, a bit line contact plug BLC, a bit line structure BL, and a memory element 125. Each memory cell may include a first trench TC1 and a second trench TC2 formed in the substrate and spaced apart from each other. The first trench TC1 may be filled with a first gate structure BG1. The second trench TC2 may be filled with a second gate structure BG2. The gate structure BG may extend in a first direction X, and the bit line structure BL may extend in a second direction Y. The first direction X may cross the second direction Y.

Each gate structure BG may include a gate insulation layer GP, a gate electrode GE, and a gate capping layer (not shown). The gate structure BG may correspond to the gate structure BG of FIG. 1A. The gate insulation layer GP may correspond to the gate insulation layer 107 of FIG. 1A. The gate structure BG may be referred to as a 'buried gate structure.'

Each bit line structure BL may include a bit line hard mask (not shown), a bit line 111, and a barrier layer (not shown). Bit line spacers 115 may be formed on both side walls of the bit line structure BL. The bit line contact plug BLC may be formed under the bit line structure BL. Each memory cell may include a storage node contact plug (not shown), a memory element 125, and a landing pad 120. The storage node contact plug (not shown) may be formed under the memory element 125. The storage node contact plug (not shown) may neighbor the bit line contact plug BLC. The storage node contact plug (not shown) may be formed spaced apart from the gate electrode GE. The landing pad 120 may overlap the storage node contact plug (not shown) and the bit line 111.

One side wall of the bit line contact plug BLC may be self-aligned with the gate structure BG. The bit line contact plug BLC may be shaped as a rectangular pillar. The bit line contact plug BLC may include a first side surface contacting the first gate structure BG1 and a second side surface contacting the second gate structure BG2. The first side surface may contact the first gate insulation layer included in the first gate structure BG1, and the second side surface may contact the second gate insulation layer included in the second gate structure BG2. The first side surface and the second side surface may be parallel with each other. The first side surface and the second side surface may have a vertical shape. The first side surface and the second side surface may have a sloped shape.

FIGS. 6A to 6I are cross-sectional views illustrating a method for manufacturing a semiconductor device according to an embodiment of the present disclosure. FIGS. 6A to 6I are cross-sectional views taken along line B-B' of FIG. 5. First, by the method illustrated in FIGS. 3A to 3I, the source/drain area SD, contact plug 19B, plug spacer 18, inter-layer insulation layer 15, gate electrode (not shown), gate insulation layer (not shown), and gate capping layer (not shown) may be formed. In FIGS. 6A to 6I, the same reference numbers are used to denote the same elements as those in FIGS. 3A to 3I. Detailed description of duplicate elements may be omitted.

Figure 6A:
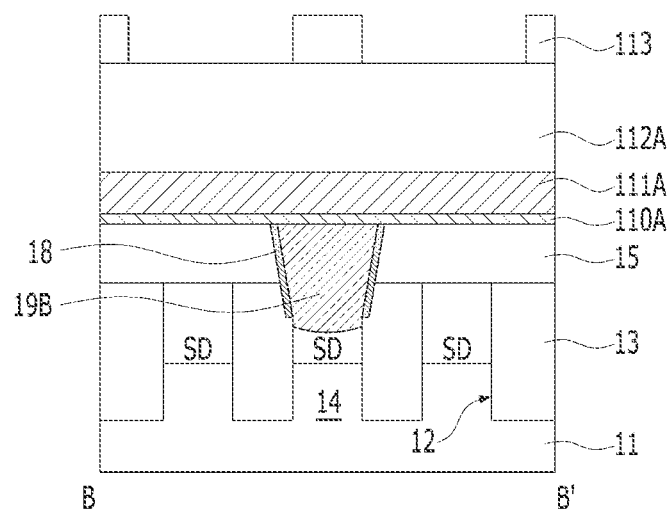

Referring to FIG. 6A, a barrier metal layer 110A may be formed on and may directly contact the inter-layer insulation layer 15 and the contact plug 19B. The height of the barrier metal layer 110A may be smaller than the height of the inter-layer insulation layer 15. The barrier metal layer 110A may include titanium nitride (TiN), tantalum nitride (TaN), tungsten nitride (WN), or a combination thereof. According to an embodiment, the barrier metal layer 110A may include a titanium nitride (TiN)-containing material.

The bit line layer 111A may be formed on and may contact the barrier metal layer 110A. The bit line layer 111A may be formed of a material having a lower resistivity than the contact plug 19B. The bit line layer 111A may include a metal material having a lower resistivity than the contact plug 19B. For example, the bit line layer 111A may include metal, metal nitride, metal silicide, or a combination thereof. The bit line layer 111A may include a tungsten-containing material that has tungsten as a main element. For example, the bit line layer 111A may be formed by stacking tungsten silicide, tungsten nitride film, and a tungsten film. According to an embodiment, the bit line layer 111A may include tungsten W or a tungsten compound.

The bit line hard mask layer 112A may be formed on and may directly contact the bit line layer 111A. The bit line hard mask layer 112A may be formed of an insulation material. The bit line hard mask layer 112A may be formed of a material having an etch selectivity to the bit line layer 111A. The bit line hard mask layer 112A may include, for example, silicon oxide, silicon nitride, silicon oxynitride, or a combination thereof. According to an embodiment, the bit line hard mask layer 112A may be formed of silicon nitride.

A bit line mask 113 may be formed on and may contact the bit line hard mask layer 112A. The bit line mask 113 may include a photoresist pattern. The bit line mask 113 may have a line shape extending in any one direction. The line width of the bit line mask 113 may be smaller than the diameter of the top surface of the contact plug 19B.

Figure 6B:
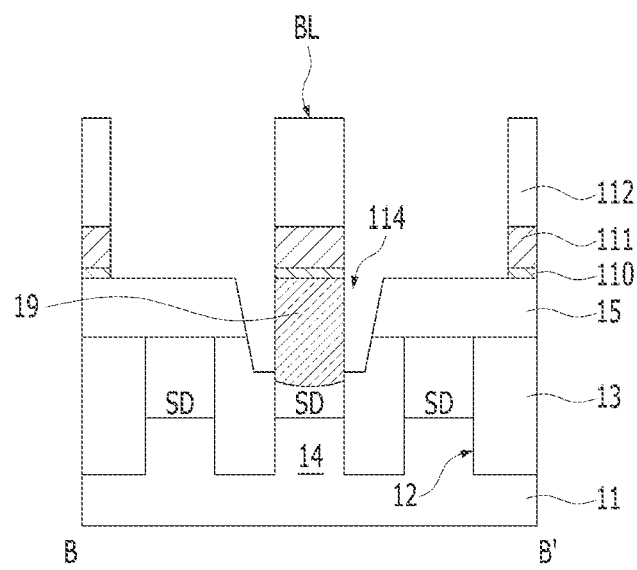

Referring to FIG. 6B, the bit line structure BL may be formed. The bit line structure BL may include a bit line contact plug 19, a barrier layer 110, a bit line 111, and a bit line hard mask 112.

The bit line hard mask layer 112A may be etched using the bit line mask 113 as an etch mask. Thus, the bit line hard mask 112 may be formed. The bit line layer 111A, barrier metal layer 110A, and contact plug 19B may be etched using the bit line hard mask 112 as an etch mask. Thus, the bit line 111, barrier layer 110, and bit line contact plug 19 may be formed. The bit line contact plug 19, barrier layer 110, bit line 111, and bit line hard mask 112 may have the same line width. The bit line 111 may extend in any one direction while covering the barrier layer 110. The bit line 111 may extend in a line shape.

As the contact plug 19B is etched, the bit line contact plug 19 may be formed on and may contact the source/drain area SD. As the contact plug 19B is etched, the plug spacer 18 may be removed. A gap 114 may be formed in a portion of the contact plug 19B and the space where the plug spacer 18 has been removed. Gaps 114 may be formed on both side walls of the bit line contact plug 19. The gaps 114 may be independently formed on both the side walls of the bit line contact plug 19. The pair of gaps 114 may be separated by the bit line contact plug 19. The bit line contact plug 19 may interconnect the source/drain area SD and the bit line 111. The diameter of the bit line contact plug 19 may be smaller than the diameter of the contact plug 19B.

Figure 6C:
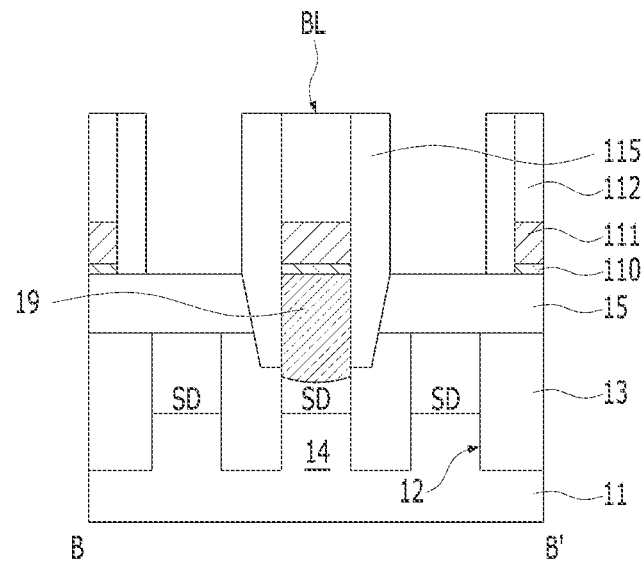

Referring to FIG. 6C, bit line spacers 115 may be formed on both of the side walls of the bit line contact plug 19 and both of the side walls of the bit line structure BL. The bit line spacer 115 may have a pillar shape filling the gap 114. The bit line spacer 115 may prevent any material from filling the gap 114 in a subsequent process. The bit line spacers 115 may be independently formed on both sides of the bit line contact plug 19. The bit line spacer 115 may extend in a line shape. The top surface of the bit line spacer 115 may be at the same level as the top surface of the bit line structure BL.

The bit line spacer 115 may include an insulation material. The bit line spacer 115 may include a low-k material. The bit line spacer 115 may include oxide or nitride. The bit line spacer 115 may include, for example, silicon oxide, silicon nitride, or metal oxide. The bit line spacer 115 may include $SiO_2$, $Si_3N_4$, or SiN. The bit line spacer 115 may include a multi-layer spacer. The bit line spacer 115 may include an air gap (not shown). Thus, a pair of line-type air gaps may be formed on both side walls of the bit line spacer 115. The pair of line-type air gaps may be symmetrical with each other. According to an embodiment, the multi-layer spacer may include a first spacer, a second spacer, and a third spacer, and the third spacer may be positioned between the first spacer and the second spacer. The multi-layer spacer may include an NON structure in which an oxide spacer is positioned between nitride spacers. According to an embodiment, the multi-layer spacer may include a first spacer, a second spacer, and an air gap between the first spacer and the second spacer.

According to an embodiment, the gap 114 may be filled not with the bit line spacer 115 but with a bit line contact insulation layer (not shown). The top surface of the bit line contact insulation layer (not shown) may be at the same level as the top surface of the bit line contact plug 19. The bit line spacer 115 may be formed on and may contact the bit line contact insulation layer (not shown). The bit line contact insulation layer (not shown) may include an insulation material.

Figure 6D:
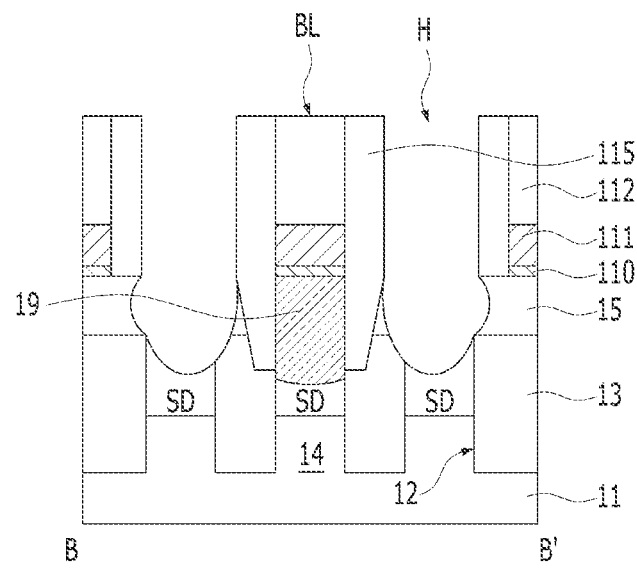

Referring to FIG. 6D, a bit line inter-layer insulation layer (not shown) may be formed to fill the space between the bit line structures BL. The bit line inter-layer insulation layer (not shown) may be planarized to expose the top of the bit line structure BL. The bit line inter-layer insulation layer (not shown) may extend parallel with the bit line structure BL.

The bit line inter-layer insulation layer (not shown) may be formed of a material having an etch selectivity to the bit line spacer 115. The bit line inter-layer insulation layer (not shown) may include an insulation material. The bit line inter-layer insulation layer (not shown) may include oxide or nitride. The bit line inter-layer insulation layer (not shown) may include, for example, silicon oxide, silicon nitride, or metal oxide. The bit line inter-layer insulation layer (not shown) may include $SiO_2$, $Si_3N_4$, or SiN. The bit line inter-layer insulation layer (not shown) may include a spin-on insulation material (e.g., spin-on dielectric (SOD)).

Subsequently, a storage node contact opening H may be formed in the bit line inter-layer insulation layer (not shown). The storage node contact opening H may be formed by etching the bit line inter-layer insulation layer (not shown) using a storage node contact opening mask (not shown) as an etch mask. The storage node contact opening H may be formed spaced apart from the bit line contact plug 19. The storage node contact opening mask (not shown) may include a photoresist pattern.

The storage node contact opening H may be formed between bit line structures BL. The bottom surface of the storage node contact opening H may extend to the inside of the substrate 11. The element isolation layer 13, inter-layer insulation layer 15, and source/drain area SD may be recessed to a predetermined depth while forming the storage node contact opening H. A portion of the substrate 11 may be exposed by the storage node contact opening H. The bottom surface of the storage node contact opening H may be positioned at a lower level than the top surface of the substrate 11. The bottom surface of the storage node contact opening H may be at a higher level than the bottom surface of the bit line contact plug 19. The bottom surface of the storage node contact opening H may be at the same level as the bottom surface of the bit line contact plug 19. A dip-out and trimming process may be performed to form the storage node contact opening H. The storage node contact opening H may be formed without loss in the bit line spacer 115 by the deep-out process. The area of the side surface and bottom of the storage node contact opening H may be increased by the trimming process. Part of the inter-layer insulation layer 15 and the substrate 11 may be removed by the trimming process. The inter-layer insulation layer 15 may be etched by dry etching. According to an embodiment, the inter-layer insulation layer 15 may be etched by isotropic etching. Accordingly, the source/drain area SD may be exposed through the storage node contact opening H. A lower portion of the storage node contact opening H may extend laterally, forming a bulb shape.

Figure 6E:
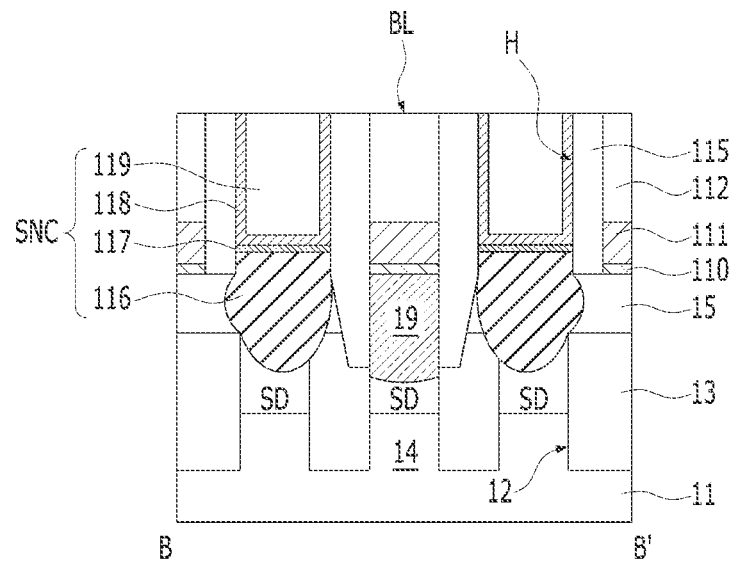

Referring to FIG. 6E, a storage node contact plug SNC may be formed in the storage node contact opening H. The storage node contact plug SNC may include a lower plug 116, an ohmic contact layer 117, a conductive liner 118, and an upper plug 119. The storage node contact plug SNC may be formed spaced apart from the bit line contact plug 19.

First, the lower plug 116 may be formed in the storage node contact opening H. To form the lower plug 116, polysilicon may be deposited to fill the storage node contact opening H, and a planarization process and an etchback process may then be performed sequentially. The bit line spacer 115 may be positioned between the bit line 111 and the lower plug 116. The bit line spacer 115 may be positioned between the bit line contact plug 19 and the lower plug 116. The bottom surface of the lower plug 116 may connect to the source/drain area SD. The top surface of the lower plug 116 may be positioned at a lower level than the top surface of the bit line 111. The lower plug 116 may include a silicon-containing material. The lower plug 116 may be doped with an impurity. For example, impurity doping may be performed by a doping process, e.g., implantation. According to an embodiment, the lower plug 116 may include, for example, polysilicon.

The ohmic contact layer 117 may be formed on and may contact the lower plug 116. To form the ohmic contact layer 117, deposition and annealing of a silicidable metal layer may be performed. The ohmic contact layer 117 may include metal silicide. The ohmic contact layer 117 may include cobalt silicide ($CoSi_x$). According to an embodiment, the ohmic contact layer 117 may include $CoSi_2$. Thus, it is possible to form low-resistance cobalt silicide while enhancing contact resistance.

The conductive liner 118 may be formed on and may directly contact the top surface of the ohmic contact layer 117 and some side surface portion of the bit line spacer 115. The conductive liner 118 may be omitted. The conductive liner 118 may include metal or metal nitride. The conductive liner 118 may include titanium (Ti), titanium nitride (TiN), titanium silicon nitride (TiSiN), tantalum (Ta), tantalum nitride (TaN), tungsten nitride (WN), or a combination thereof. According to an embodiment, the conductive liner 118 may include titanium nitride.

The upper plug 119 may be formed on and may contact the conductive liner 118. The upper plug 119 may fill the rest of the storage node contact opening H. The upper plug 119 may be formed, for example, by chemical vapor deposition (CVD), physical vapor deposition (PVD), or atomic layer deposition (ALD). To increase the deposition effect, the upper plug 119 may use a plasma. For example, the upper plug 119 may be formed by, e.g., plasma enhanced CVD (PECVD) or plasma enhanced ALD (PEALD). According to an embodiment, the upper plug 119 may be formed, for example, by chemical vapor deposition (CVD). The upper plug 119 may be planarized to expose the top surface of the bit line structure BL. Accordingly, the top surface of the upper plug 119 and the top surface of the bit line structure BL may be at the same level.

The upper plug 119 may include a metal-containing material. The upper plug 119 may include a conductive material. The upper plug 119 may include one or more of gold (Au), silver (Ag), copper (Cu), aluminum (Al), nickel (Ni), tungsten (W), titanium (Ti), platinum (Pt), palladium (Pd), Tin (Sn), lead (Pb), zinc (Zn), indium (In), cadmium (Cd), chromium (Cr), and molybdenum (Mo). According to an embodiment, the upper plug 119 may include a tungsten (W)-containing material. The upper plug 119 may include tungsten (W).

Figure 6F:
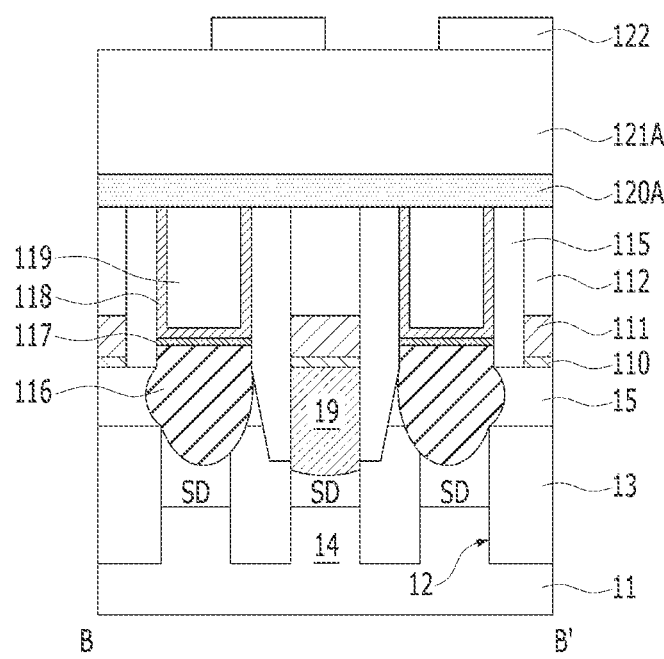

Referring to FIG. 6F, a landing pad layer 120A may be formed on and may directly contact the upper plug 119, bit line spacer 115, and bit line hard mask 112. The landing pad layer 120A may include a metal-containing material. The landing pad layer 120A may be formed of a single film or a multi-layer film. The landing pad layer 120A may include a conductive material. The landing pad layer 120A may include a metal-containing material. The landing pad layer 120A may include one or more of gold (Au), silver (Ag), copper (Cu), aluminum (Al), nickel (Ni), tungsten (W), titanium (Ti), platinum (Pt), palladium (Pd), Tin (Sn), lead (Pb), zinc (Zn), indium (In), cadmium (Cd), chromium (Cr), and molybdenum (Mo). According to an embodiment, the landing pad layer 120A may include a tungsten (W)-containing material. The landing pad layer 120A may include tungsten (W), PVD-W, or a tungsten compound.

A landing pad hard mask layer 121A and a landing pad mask 122 may sequentially be formed on the landing pad layer 120A. The landing pad hard mask layer 121A may include an insulation material. The landing pad mask 122 may include a photoresist pattern. The landing pad mask 122 may have a line shape extending in any one direction.

Figure 6G:
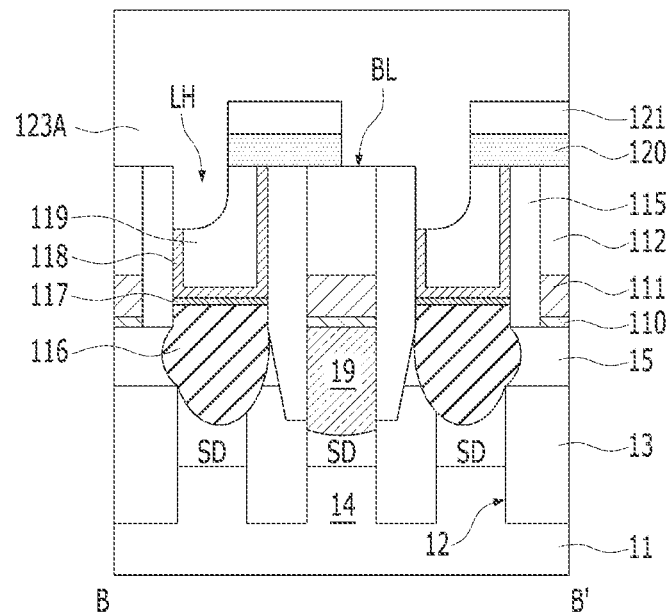
Figure 6G:
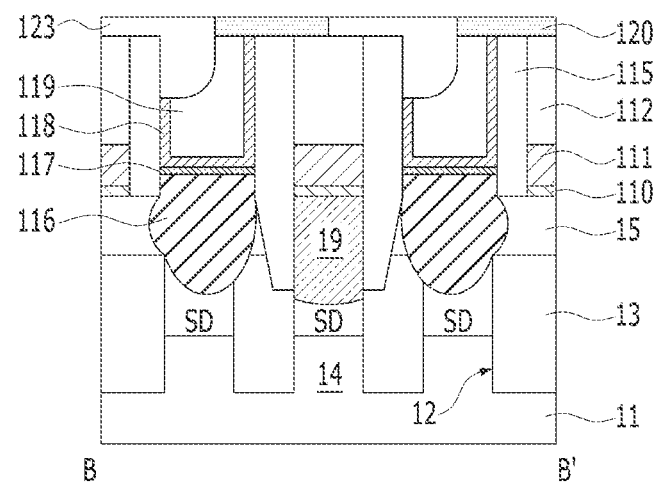

Referring to FIG. 6G, the landing pad hard mask 121 may be formed by etching the landing pad hard mask layer 121A using the landing pad mask 122 as an etch mask. A landing pad 120 may be formed by etching the landing pad layer 120A using the landing pad hard mask 121 as an etch mask. The landing pad 120 may partially overlap the bit line structure BL. The landing pad 120 may be electrically connected with the upper plug 119. A landing pad hole LH may be formed in the upper plug 119. The shape of the landing pad hole LH may not be constant. The bottom surface of the landing pad hole LH may be at a higher level than the bottom surface of the bit line hard mask 112. The top of the bit line spacer 115 and the upper plug 119 may be exposed by etching a portion of the upper plug 119 using the landing pad hard mask 121 as an etch mask.

Subsequently, a capping layer 123A may be formed on and may directly contact the upper plug 119 and the landing pad 120. The capping layer 123A may cover the landing pad 120, landing pad hard mask 121, bit line spacer 115, bit line hard mask 112, and upper plug 119. The capping layer 123A may fill the landing pad hole LH. The height of the capping layer 123A may be larger than the sum of the height of the landing pad 120 and the height of the landing pad hard mask 121.

The capping layer 123A may include a poor step-coverage material. For example, the capping layer 123A may be formed using plasma chemical vapor deposition (PECVD). The capping layer 123A may include an insulation material. The capping layer 123A may include oxide or nitride. The capping layer 123A may include, for example, silicon oxide or silicon nitride. The capping layer 123A may include, for example, silicon nitride.

Referring to FIG. 6H, the capping layer 123A may be etched using a capping mask (not shown) as an etch mask. Thus, a cell capping layer 123 may be formed. As the capping layer 123A is etched, the top surface of the landing pad 120 may be partially etched. The top surface level of the cell capping layer 123 may be identical to the top surface level of the landing pad 120.

The cell capping layer 123 may fill the space between the upper plug 119 and the landing pad 120. The cell capping layer 123 may cover the top of the bit line spacer 115. The cell capping layer 123 may be planarized to expose the top surface of the landing pad 120. The cell capping layer 123 may extend parallel with the landing pad 120. The cell capping layer 123 may play a role to protect the landing pad 120 from the subsequent process.

Figure 6I:
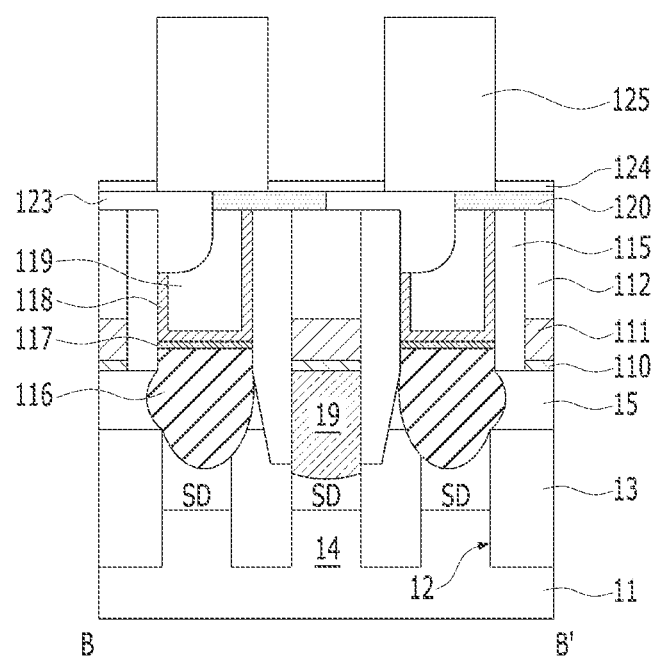

Referring to FIG. 6I, an etch stop layer 124 may be formed on and may contact the landing pad 120 and the cell capping layer 123. A memory element 125 may be formed on and may contact the landing pad 120 to electrically connect to the landing pad 120. The memory element 125 may be implemented in various shapes. The memory element 125 may be a capacitor. Thus, the memory element 125 may include a storage node contacting the landing pad 120.

The storage node may be shaped as a cylinder or a pillar. A capacitor dielectric layer may be formed on and may contact the surface of the storage node. The capacitor dielectric layer may include at least one selected from zirconium oxide, aluminum oxide, or hafnium oxide. For example, the capacitor dielectric layer may have a ZAZ structure in which a first zirconium oxide, an aluminum oxide, and a second zirconium oxide are stacked one over another. A plate node is formed on the capacitor dielectric layer. The storage node and the plate node may include a metal-containing material. The memory element 125 may include a variable resistor. The variable resistor may include a phase change material. According to an embodiment, the variable resistor may include transition metal oxide. According to an embodiment, the variable resistor may be a magnetic tunnel junction (MTJ).

Figure 7:
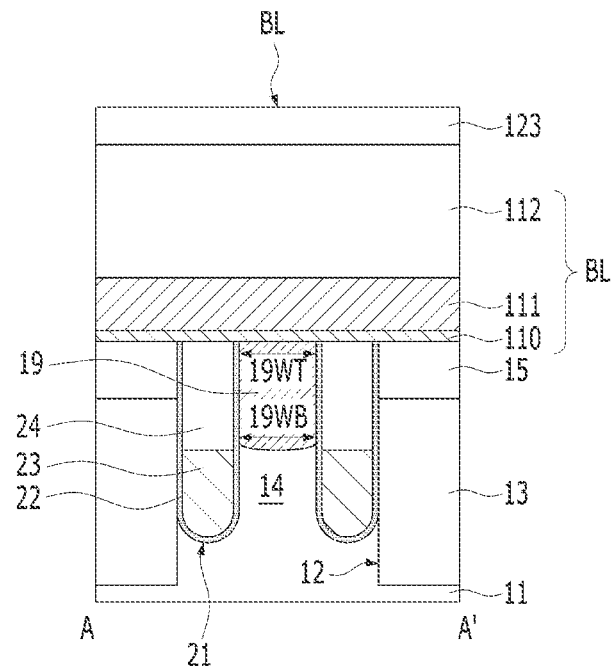
FIG. 7 is a cross-sectional view illustrating a semiconductor device according to an embodiment of the present disclosure.

FIG. 7 is a cross-sectional view illustrating a semiconductor device 300, taken along line A-A' of FIG. 5 for the steps of FIG. 6I. In FIG. 7, the same reference numbers are used to denote the same elements as those in FIGS. 6A to 6I. Detailed description of duplicate elements may be omitted.

Referring to FIG. 7, a bit line structure BL may be positioned on the bit line contact plug 19 and the inter-layer insulation layer 15. The bit line structure BL may include a bit line contact plug 19, a barrier layer 110, a bit line 111, and a bit line hard mask 112. A cell capping layer 123 may be formed on and may directly contact the bit line structure BL.

Trenches 21 may be positioned on both side walls of the bit line contact plug 19. The trenches 21 may be positioned in the substrate 11 and be aligned with both of the side walls of the bit line contact plug 19. The gate insulation layer 22, gate electrode 23, and gate capping layer 24 may be positioned inside the trench 21.

The gate insulation layer 22 may be positioned directly on the surface of the trench 21 and the side wall of the bit line contact plug 19. The gate insulation layer 22 may be positioned between the gate capping layer 24 and the bit line contact plug 19. The gate insulation layer 22 may have a shape vertically extending from the bottom surface of the trench 21.

The gate electrode 23 may be formed on and may directly contact the gate insulation layer 22. The gate electrode 23 may have a recessed shape meaning that it is only partially filling the trench 21. The top surface of the gate electrode 23 may be at a lower level than the bottom surface of the bit line contact plug 19. The top surface of the gate electrode 23 may be at a lower level than the top surface of the active area 14. The rest of the trench 21 on the gate electrode 23 may be filled with the gate capping layer 24. The top surface of the gate capping layer 24 may be at the same level as the top surface of the inter-layer insulation layer 15.

The width 19WT of the top portion of the bit line contact plug 19 may be identical to the width 19WB of the bottom portion. The bit line contact plug 19 may neighbor the gate electrode 23 and the gate capping layer 24, with the gate insulation layer 22 interposed therebetween. The bit line contact plug 19 may directly contact the gate insulation layer 22. A side wall of the bit line contact plug 19 may be self-aligned with the gate insulation layer 22. The bit line contact plug 19 may be shaped as a rectangular pillar. The bit line contact plug 19 may correspond to the bit line contact plug BLC of FIG. 5. The bottom surface of the bit line contact plug may be curved as shown in FIG. 7, however, the bit line contact plug is not limited to this configuration.

A short defect between the bit line contact plug 19 and the gate electrode 23 may be mitigated by the gate insulation layer 22. Accordingly, the characteristics of the semiconductor device may be enhanced.

Figure 8:
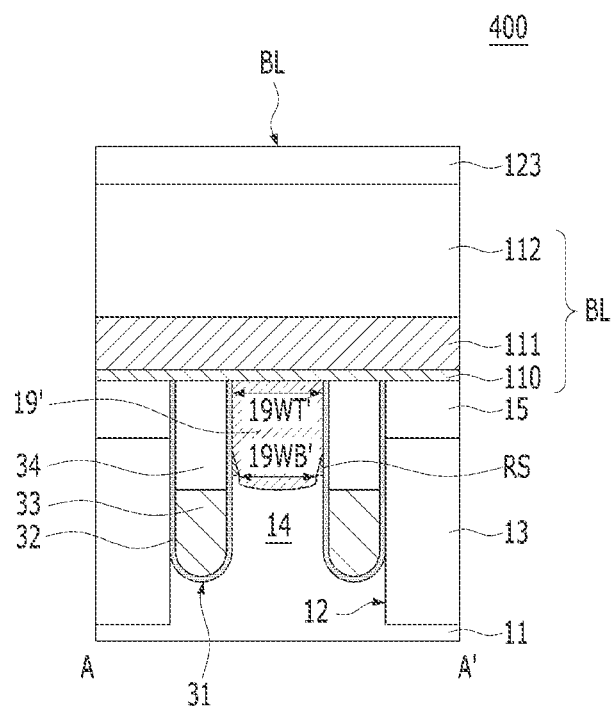
FIG. 8 is a cross-sectional view illustrating a semiconductor device according to an embodiment of the present disclosure.

FIG. 8 is a cross-sectional view illustrating a semiconductor device 400 according to an embodiment of the present disclosure. FIG. 8 is a cross-sectional view taken along line A-A' of FIG. 5. The semiconductor device 400 of FIG. 8 may be similar to the semiconductor device 300 of FIG. 7. In FIG. 8, the same reference numbers are used to denote the same elements as those in FIGS. 4A to 4D and FIGS. 6A to 6I. Detailed description of duplicate elements may be omitted.

First, the gate insulation layer 32, gate electrode 33, and gate capping layer 34 may be formed in the trench 31 by the method described above in connection with FIGS. 4A to 4D. Subsequently, the bit line structure BL, storage node contact (not shown), landing pad (not shown), and memory element (not shown) may be formed by the method described above in connection with FIGS. 6A to 6I. The bit line structure BL may include a bit line contact plug 19', a barrier layer 110, a bit line 111, and a bit line hard mask 112. A cell capping layer 123 may be formed on and may contact the bit line structure BL.

Referring to FIG. 8, a bit line structure BL may be positioned on the bit line contact plug 19' and the inter-layer insulation layer 15. Trenches 31 may be positioned on both side walls of the bit line contact plug 19'. The gate insulation layer 32, gate electrode 33, and gate capping layer 34 may be positioned inside the trench 31.

The gate insulation layer 32 may be formed on and may directly contact the surface of the trench 31 and the side wall of the bit line contact plug 19'. The gate insulation layer 32 may have a shape vertically extending from the bottom surface of the trench 31. The gate insulation layer 32 may be positioned between the gate capping layer 34 and the bit line contact plug 19'.

The gate electrode 33 may be formed on and may directly contact the gate insulation layer 32. The gate electrode 33 may have a recessed shape meaning that it is only partially filling the trench 31. The top surface of the gate electrode 33 may be at a lower level than the bottom surface of the bit line contact plug 19'. The top surface of the gate electrode 33 may be at a lower level than the top surface of the active area 14. The remainder of the trench 31 above the gate electrode 33 may be filled with the gate capping layer 34. The top surface of the gate capping layer 34 may be at the same level as the top surface of the inter-layer insulation layer 15.

The width 19WT' of the top portion of the bit line contact plug 19' may be larger than the width 19WB' of the bottom portion. The bottom spacer RS may be positioned on the lower outer wall of the bit line contact plug 19'. The bottom spacer RS may be positioned on the outer wall of the bit line contact plug 19' in the area which is narrower than the width 19WT' of the top portion of the bit line contact plug 19' and is wider than the width 19WB' of the bottom portion. The bottom spacer RS may be positioned between the trench 31 and the bottom edge of the bit line contact plug 19'. The bottom spacer RS may have a shape surrounding the lower outer wall of the bit line contact plug 19'. From a top view, the bottom spacer RS may have a ring shape. The thickness of the bottom spacer RS may increase from the higher level to the lower level. The bottom surface of the bottom spacer RS may be positioned at a higher level than the bottom surface of the bit line contact plug 19'.

The bit line contact plug 19' may neighbor the gate electrode 33 and the gate capping layer 34, with the gate insulation layer 32 interposed therebetween. The bit line contact plug 19' may directly contact the gate insulation layer 32. A side wall of the bit line contact plug 19' may be self-aligned with the gate insulation layer 32. The bit line contact plug 19' may directly contact the bottom spacer RS. The bit line contact plug 19' may neighbor the gate insulation layer 32, with the bottom spacer RS interposed therebetween.

A short defect between the bit line contact plug 19' and the gate electrode 33 may be mitigated by the gate insulation layer 32. Since the bottom spacer RS is formed on the lower outer wall of the bit line contact plug 19', the short defect between the bit line contact plug 19' and the gate electrode 33 may be further mitigated. Accordingly, the characteristics of the semiconductor device may be enhanced.

Figure 9A:
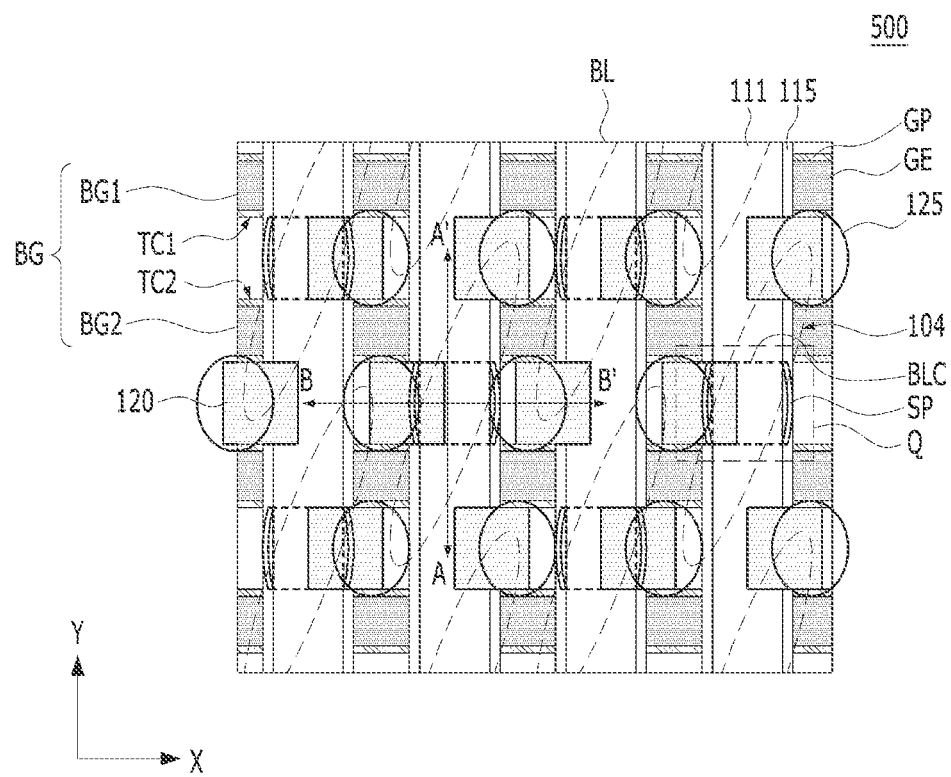
FIGS. 9A and 9B are top views illustrating a semiconductor device according to an embodiment of the present disclosure.
Figure 9B:
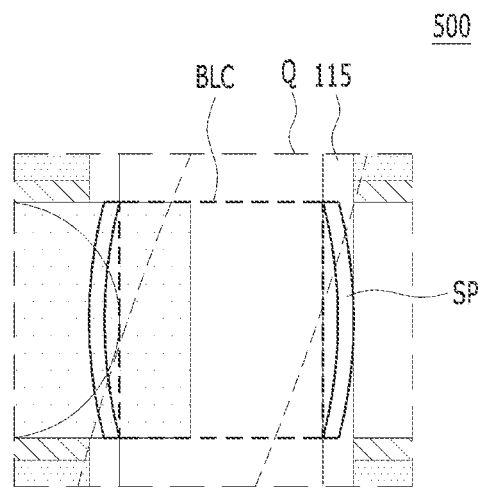

FIGS. 9A and 9B are cross-sectional views illustrating a top view of a semiconductor device according to an embodiment of the present disclosure. FIG. 9B is an enlarged view of portion Q of FIG. 9A. The semiconductor device 500 of FIGS. 9A and 9B may be similar to the semiconductor device 300 of FIG. 5. In FIGS. 9A and 9B, the same reference numbers denote the same elements as those of FIG. 5. Detailed description of duplicate elements may be omitted.

Referring to FIG. 9A, the semiconductor device 500 may include a plurality of memory cells. Each memory cell may include an active area 104, a gate structure BG, a bit line contact plug BLC, a plug spacer SP, a bit line structure BL, a storage node contact plug (not shown), and a memory element 125.

Each memory cell may include a first trench TC1 and a second trench TC2 formed in the substrate and spaced apart from each other. The first trench TC1 may be filled with a first gate structure BG1. The second trench TC2 may be filled with a second gate structure BG2.

Each gate structure BG may include a gate insulation layer GP, a gate electrode GE, and a gate capping layer (not shown). Each bit line structure BL may include a bit line 111, a bit line spacer 115, and a bit line contact plug BLC. Each memory cell may include a storage node contact plug (not shown) and a landing pad 120 on the storage node contact plug (not shown).

Referring to FIG. 9B, one side wall of the bit line contact plug BLC may be self-aligned with the gate structure BG. The bit line contact plug BLC may be shaped as a rectangular pillar. The bit line contact plug BLC may include a first side surface contacting the first gate structure BG1 and a second side surface contacting the second gate structure BG2. The first side surface may contact the first gate insulation layer included in the first gate structure BG1, and the second side surface may contact the second gate insulation layer included in the second gate structure BG2. The first side surface and the second side surface may be parallel with each other. The first side surface and the second side surface may have a vertical shape. The first side surface and the second side surface may have a sloped shape.

A plug spacer SP may be positioned under the bit line spacer 115. The plug spacer SP may include a pair of side walls facing each other and positioned on both sides of the bit line contact plug BLC. The plug spacer SP may include a pair of curved or round side walls facing each other. The plug spacer SP may be positioned in the direction crossing the first and second gate structures BG1 and BG2. The plug spacer SP may not overlap the first and second gate structures BG1 and BG2. The plug spacer SP may neighbor the storage node contact plug (not shown). The thickness of the plug spacer SP may be smaller than the thickness of the bit line spacer 115. The plug spacer SP may correspond to the plug spacer SP of FIG. 1.

FIGS. 10A to 10E are cross-sectional views illustrating a method for manufacturing a semiconductor device 500 according to an embodiment of the present disclosure. FIGS. 10A to 10E are cross-sectional views taken along line B-B' of FIG. 9. The semiconductor device 500 of FIGS. 10A to 10E may be similar to the semiconductor device 300 of FIGS. 6A to 6I. Thus, by the method illustrated in FIGS. 3A to 3K, the source/drain area SD, contact plug 19B, plug spacer 18, inter-layer insulation layer 15, gate electrode (not shown), gate insulation layer (not shown), and gate capping layer (not shown) may be formed. In FIGS. 10A to 10E, the same reference numbers are used to denote the same elements as those in FIGS. 3A to 3K and FIGS. 6A to 6I. Detailed description of duplicate elements may be omitted.

Figure 10A:
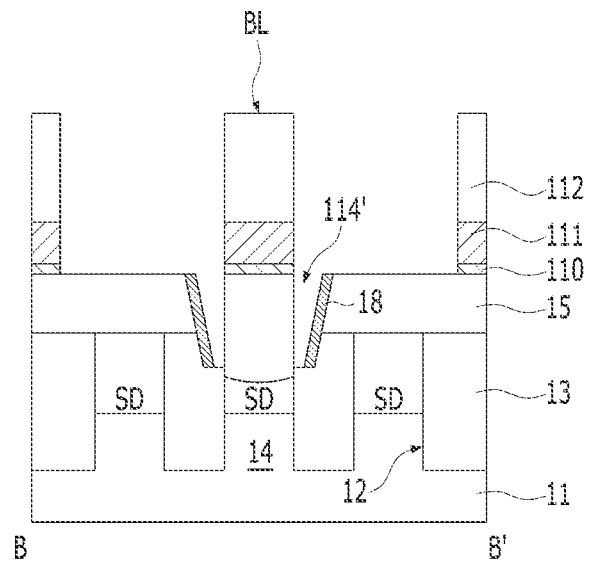
FIGS. 10A, 10B, 10C, and 10D are views illustrating a method for manufacturing a semiconductor device according to an embodiment of the present disclosure.

Referring to FIG. 10A, a barrier metal layer (not shown), a bit line layer (not shown), a bit line hard mask layer (not shown), and a bit line mask (not shown) may be formed on the inter-layer insulation layer 15 and the contact plug 19B. The bit line hard mask layer (not shown), the bit line layer (not shown), the barrier metal layer (not shown), and the contact plug 19B may be etched using the bit line mask (not shown) as an etch mask. Thus, a bit line structure BL including the bit line contact plug 19, the barrier layer 110, the bit line 111, and the bit line hard mask 112 may be formed. The bit line contact plug 19, barrier layer 110, bit line 111, and bit line hard mask 112 may have the same line width.

As the contact plug 19B is etched, the bit line contact plug 19 may be formed on the source/drain area SD. As the contact plug 19B is etched, the plug spacer 18 may not be removed. There may be a pair of plug spacers 18 facing each other and positioned on both sides of the bit line contact plug 19. The plug spacer 18 may not directly contact the bit line contact plug 19. The plug spacer 18 may not overlap the gate electrode (not shown). The plug spacer 18 may not overlap the trenches (not shown). The plug spacer 18 may be formed to extend in a direction parallel with the bit line 111. The top view of the plug spacer 18 may have a curved or round shape. The side wall profile of the plug spacer 18 may have a sloped shape. The plug spacer 18 may correspond to the plug spacer SP of FIG. 1. The plug spacer 18 may further include a bottom spacer.

Gaps 114' may be formed in spaces where a portion of the contact plug 19B has been removed. Gaps 114' may be formed on both side walls of the bit line contact plug 19. The gaps 114' may be formed between the bit line contact plug 19 and the plug spacer 18. The gaps 114' may be independently formed on both the side walls of the bit line contact plug 19. The pair of gaps 114' may be separated by the bit line contact plug 19. The diameter of the bit line contact plug 19 may be smaller than the diameter of the contact plug 19B.

Figure 10B:
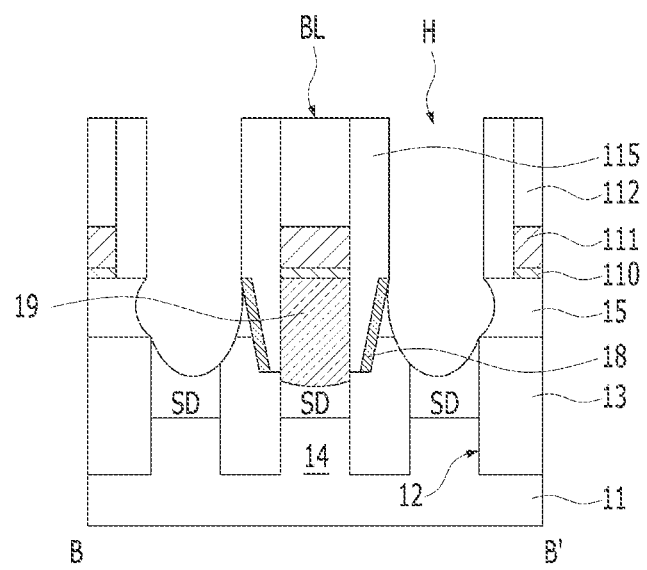

Referring to FIG. 10B, bit line spacers 115 may be formed on both of the side walls of the bit line contact plug 19 and both of the side walls of the bit line structure BL. The bit line spacer 115 may have a pillar shape filling the gap 114'. According to an embodiment, the gap 114 may be filled not with the bit line spacer 115 but with a bit line contact insulation layer (not shown). In this case, the bit line spacer 115 may be formed on and may contact the bit line contact insulation layer (not shown). The bit line spacer 115 may include a multi-layer spacer. The bit line spacer 115 may include an air gap (not shown).

Subsequently, a storage node contact opening H may be formed between bit line structures BL. The bottom surface of the storage node contact opening H may extend to the inside of the substrate 11. A portion of the substrate 11 may be exposed by the storage node contact opening H. A lower portion of the storage node contact opening H may extend laterally, forming a bulb shape.

Figure 10C:
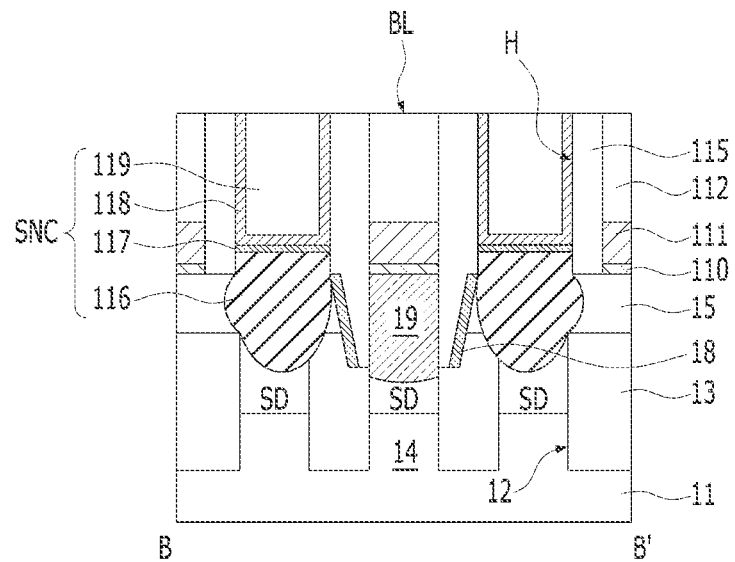

Referring to FIG. 10C, a storage node contact plug SNC may be formed in the storage node contact opening H. The storage node contact plug SNC may include a lower plug 116, an ohmic contact layer 117, a conductive liner 118, and an upper plug 119. The storage node contact plug SNC may neighbor the plug spacer 18. The storage node contact plug SNC may be spaced apart from the bit line contact plug 19 and connected to the substrate 11. The storage node contact plug SNC may be spaced apart from the bit line contact plug 19 and gate electrode (not shown) and connected to the substrate 11.

Figure 10D:
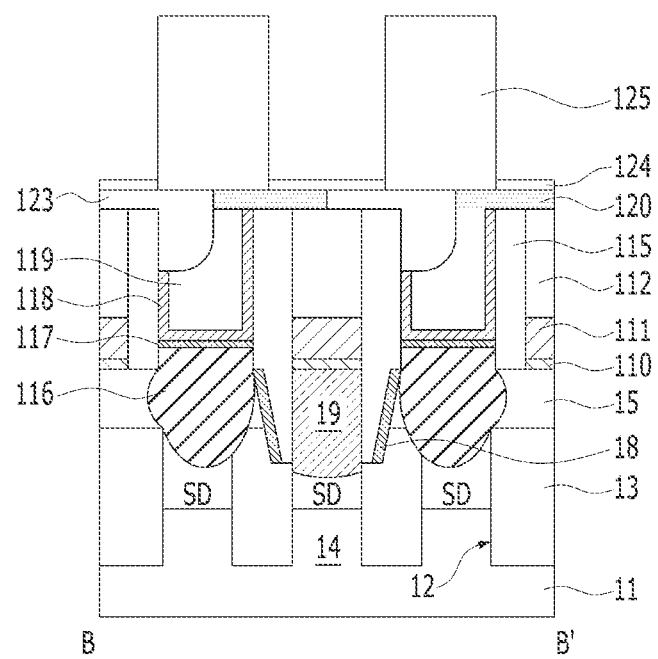

Referring to FIG. 10D, a landing pad 120 may be formed on the bit line structure BL to partially overlap the bit line structure BL. The landing pad 120 may be electrically connected with the upper plug 119.

Subsequently, a cell capping layer 123 may be formed to cover a portion of the bit line structure BL, the side wall of the landing pad 120, and the top surface of the upper plug 119. The cell capping layer 123 may fill the space between the upper plug 119 and the landing pad 120.

An etch stop layer 124 may be formed on and may contact the landing pad 120 and the cell capping layer 123. A memory element 125 may be formed on and may contact the landing pad 120 to electrically connect to the landing pad 120. The memory element 125 may be implemented in various shapes. The memory element 125 may be a capacitor. Thus, the memory element 125 may include a storage node contacting the landing pad 120.

The cross-sectional view of the semiconductor device 500, taken along line A-A' of FIG. 9A may be identical to that of FIG. 7.

Referring to FIG. 7, a bit line structure BL may be positioned on the bit line contact plug 19 and the inter-layer insulation layer 15. The width 19WT of the top portion of the bit line contact plug 19 may be identical to the width 19WB of the bottom portion. The bit line contact plug 19 may directly contact the gate insulation layer 22. A side wall of the bit line contact plug 19 may be self-aligned with the gate insulation layer 22. The bit line contact plug 19 may be shaped as a rectangular pillar. The bit line contact plug 19 may correspond to the bit line contact plug BLC of FIG. 9A.

A short defect between the bit line contact plug 19 and the gate electrode 23 may be mitigated by the gate insulation layer 22. Since a pair of plug spacers 18 remain, which are positioned on both sides of the bit line contact plug 19 and facing each other, a short defect due to the bit line contact plug 19' may be further mitigated. Accordingly, the characteristics of the semiconductor device may be enhanced.

The cross-sectional view of the semiconductor device, taken along line A-A' of FIG. 9A may be identical to that of FIG. 8. First, the gate insulation layer 32, gate electrode 33, and gate capping layer 34 may be formed by the method described above in connection with FIGS. 4A to 4D. Subsequently, the bit line structure BL, storage node contact (not shown), landing pad (not shown), and memory element (not shown) may be formed by the method described above in connection with FIGS. 10A to 10D.

The width 19WT' of the top portion of the bit line contact plug 19' may be larger than the width 19WB' of the bottom portion as shown in FIG. 8. The bottom spacer RS may have a shape surrounding the lower outer wall of the bit line contact plug 19'. From a top view, the bottom spacer RS may have a ring shape. The thickness of the bottom spacer RS may increase from the higher level to the lower level.

According to an embodiment, the plug spacer (not shown) may include the bottom spacer RS. The bottom spacer RS may be connected with the plug spacer (not shown). The bit line contact plug 19' may directly contact the bottom spacer RS. The bit line contact plug 19' may not directly contact the plug spacer (not shown).

The bit line contact plug 19' may directly contact the gate insulation layer 32. A side wall of the bit line contact plug 19' may be self-aligned with the gate insulation layer 32. The bit line contact plug 19' may neighbor the gate insulation layer 32, with the bottom spacer RS interposed therebetween.

A short defect between the bit line contact plug 19' and the gate electrode 33 may be mitigated by the gate insulation layer 32. Since the bottom spacer RS is formed on the lower outer wall of the bit line contact plug 19', the short defect between the bit line contact plug 19' and the gate electrode 33 may be mitigated. Since a pair of plug spacers 18 remain, which are positioned on both sides of the bit line contact plug 19 and facing each other, a short defect due to the bit line contact plug 19' may be further mitigated. Accordingly, the characteristics of the semiconductor device may be enhanced.

One of ordinary skill in the art will recognize that the various embodiments of the present disclosure as described above are not limited to the above-described embodiments and those shown in the drawings, but that various changes, modifications, or alterations may be made thereto without departing from the spirit and scope of the invention as defined in the following claims.

What is claimed is:

1. A semiconductor device, comprising:
a substrate;
a bit line contact plug positioned in the substrate;
a trench positioned in the substrate and aligned with a side wall of the bit line contact plug;
a gate insulation layer formed on a surface of the trench and the side wall of the bit line contact plug; and
a gate electrode partially filling the trench on the gate insulation layer,
wherein the gate insulation layer includes a first oxide, and
wherein a top surface of the gate insulation layer is positioned at the same level as a top surface of the bit line contact plug.

2. The semiconductor device of claim 1, wherein the gate insulation layer further includes a second oxide, and
wherein the second oxide extends from the first oxide.

3. The semiconductor device of claim 2, wherein the first oxide and the second oxide include the same material.

4. The semiconductor device of claim 2, wherein the first oxide and the second oxide include silicon oxide.

5. The semiconductor device of claim 1, wherein a top surface of the gate electrode is at a lower level than a bottom surface of the bit line contact plug.

6. The semiconductor device of claim 1, further comprising:
a gate capping layer positioned on the gate electrode and filling the trench, wherein the gate insulation layer extends to be positioned between the gate capping layer and the bit line contact plug.

7. The semiconductor device of claim 1, further comprising:
an inter-layer insulation layer on the substrate,
wherein the bit line contact plug and the trench penetrate the inter-layer insulation layer and extend to an inside of the substrate.

8. The semiconductor device of claim 1, further comprising:
a storage node contact plug spaced apart from the bit line contact plug and the gate electrode and connected with the substrate; and
a plug spacer not overlapping the trench and neighboring the storage node contact plug.

9. The semiconductor device of claim 1, further comprising:
a bottom spacer positioned between the trench and a bottom edge of the bit line contact plug.

10. The semiconductor device of claim 9, wherein the bottom spacer has a shape surrounding a lower outer wall of the bit line contact plug.

11. A semiconductor device, comprising:
a substrate including an active area;
a first trench and a second trench spaced apart from each other and extending in the substrate;
a bit line contact plug positioned between the first trench and the second trench and formed in the substrate;
a first gate insulation layer formed on a surface of the first trench and a side wall of the bit line contact plug;
a second gate insulation layer formed on a surface of the second trench and another side wall of the bit line contact plug;
a first gate electrode partially filling the first trench, on the first gate insulation layer; and
a second gate electrode partially filling the second trench, on the second gate insulation layer,
wherein the first gate insulation layer includes an oxide of a side wall of the bit line contact plug,
wherein the second gate insulation layer includes an oxide of another side wall of the bit line contact plug, and
wherein top surfaces of the first and second gate insulation layer are positioned at the same level as a top surface of the bit line contact plug, respectively.

12. The semiconductor device of claim 11, wherein the first gate insulation layer further includes an oxide of the substrate, the oxide of the substrate extending from the oxide of the side wall of the bit line contact plug, and
wherein the second gate insulation layer further includes the oxide of the substrate, the oxide of the substrate extending from the oxide of the other side wall of the bit line contact plug.

13. The semiconductor device of claim 11, wherein a top surface of the first gate electrode and the second gate electrode is at a lower level than a bottom surface of the bit line contact plug.

14. The semiconductor device of claim 11, further comprising:
a first gate capping layer positioned on the first gate electrode and filling the first trench; and
a second gate capping layer positioned on the second gate electrode and filling the second trench, wherein the first gate insulation layer extends to be positioned between the first gate capping layer and the bit line contact plug, and wherein the second gate insulation layer extends to be positioned between the second gate capping layer and the bit line contact plug.

15. The semiconductor device of claim 11, further comprising:
    a storage node contact plug spaced apart from the bit line contact plug, the first gate electrode, and the second gate electrode, the storage node contact plug connected with the substrate; and
    a plug spacer not overlapping the first trench and the second trench, the plug spacer neighboring the storage node contact plug.

16. The semiconductor device of claim 11, further comprising:
    a bottom spacer positioned between the first trench and a bottom edge of the bit line contact plug and between the second trench and the bottom edge of the bit line contact plug.

17. The semiconductor device of claim 16, wherein the bottom spacer has a shape surrounding a lower outer wall of the bit line contact plug.

* * * * *